(12) United States Patent
Tsao

(10) Patent No.: US 11,532,617 B2
(45) Date of Patent: Dec. 20, 2022

(54) SEMICONDUCTOR STRUCTURE AND METHOD OF FORMING THE SAME

(71) Applicant: MEDIATEK INC., Hsinchu (TW)

(72) Inventor: Po-Chao Tsao, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 59 days.

(21) Appl. No.: 17/134,694

(22) Filed: Dec. 28, 2020

(65) Prior Publication Data

US 2021/0313317 A1  Oct. 7, 2021

Related U.S. Application Data

(60) Provisional application No. 63/006,154, filed on Apr. 7, 2020.

(51) Int. Cl.
*H01L 27/088* (2006.01)
*H01L 29/06* (2006.01)
(Continued)

(52) U.S. Cl.
CPC ...... *H01L 27/088* (2013.01); *H01L 21/02603* (2013.01); *H01L 29/0673* (2013.01);
(Continued)

(58) Field of Classification Search
CPC ............ H01L 27/088; H01L 21/02603; H01L 29/0673; H01L 29/42392; H01L 29/66522;
(Continued)

(56) References Cited

U.S. PATENT DOCUMENTS

| 10,038,054 | B2 | 7/2018 | Rachmady et al. |
| 11,069,818 | B2 | 7/2021 | Kang et al. |

(Continued)

FOREIGN PATENT DOCUMENTS

| CN | 110911474 A | 3/2020 |
| TW | 201344909 A | 11/2013 |

OTHER PUBLICATIONS

Chinese language office action dated Jan. 4, 2022, issued in application No. TW 110112113.
(Continued)

*Primary Examiner* — Tong-Ho Kim
(74) *Attorney, Agent, or Firm* — McClure, Qualey & Rodack, LLP

(57) ABSTRACT

A semiconductor structure includes the first semiconductor stack and the second semiconductor stack formed over the first region and the second region of a substrate, respectively. The first and second semiconductor stacks extend in the first direction and are spaced apart from each other in the second direction. Each of the first semiconductor stack and the second semiconductor stack includes channel layers and a gate structure. The channel layers are formed above the substrate and are spaced apart from each other in the third direction. The gate structure includes the gate dielectric layers formed around the respective channel layers, and the gate electrode layer formed on the gate dielectric layers to surround the channel layers. The number of channel layers in the first semiconductor stack is different from the number of channel layers in the second semiconductor stack.

19 Claims, 11 Drawing Sheets

(51) Int. Cl.
    *H01L 29/423*      (2006.01)
    *H01L 29/786*      (2006.01)
    *H01L 21/02*      (2006.01)
    *H01L 29/66*      (2006.01)

(52) U.S. Cl.
CPC .. *H01L 29/42392* (2013.01); *H01L 29/66522* (2013.01); *H01L 29/66545* (2013.01); *H01L 29/66787* (2013.01); *H01L 29/78618* (2013.01); *H01L 29/78681* (2013.01); *H01L 29/78684* (2013.01); *H01L 29/78696* (2013.01)

(58) Field of Classification Search
CPC ......... H01L 29/66545; H01L 29/66787; H01L 29/78618; H01L 29/78681; H01L 29/78684; H01L 29/78696; H01L 21/823412; H01L 29/66439; H01L 29/775; H01L 29/785; H01L 29/1054; H01L 29/66795; B82Y 10/00
USPC ....................................................... 257/347
See application file for complete search history.

(56) References Cited

U.S. PATENT DOCUMENTS

| | | |
|---|---|---|
| 2015/0069328 A1 | 3/2015 | Leobandung |
| 2015/0370947 A1 | 12/2015 | Moroz et al. |
| 2017/0154960 A1* | 6/2017 | Rachmady ............. B82Y 10/00 |
| 2017/0287788 A1* | 10/2017 | Doris ............. H01L 21/823437 |
| 2018/0033971 A1 | 2/2018 | Bridges et al. |
| 2018/0190835 A1* | 7/2018 | Lee ................... H01L 21/02603 |
| 2020/0013896 A1 | 1/2020 | Xu et al. |
| 2020/0043802 A1 | 2/2020 | Cheng et al. |
| 2020/0044087 A1* | 2/2020 | Guha ................ H01L 29/42392 |
| 2020/0091349 A1* | 3/2020 | Kang ............. H01L 21/823412 |

OTHER PUBLICATIONS

European Search Report dated Aug. 6, 2021, issued in application No. EP 21163906.7.

* cited by examiner

SEMICONDUCTOR STRUCTURE AND METHOD OF FORMING THE SAME

CROSS REFERENCE TO RELATED APPLICATIONS

This application is based on, and claims priority of U.S. Provisional Application No. 63/006,154 filed on Apr. 7, 2020, the entirety of which is incorporated by reference herein.

BACKGROUND OF THE INVENTION

Field of the Invention

The present invention relates to a semiconductor structure and a method of forming the same, and in particular to a semiconductor structure including nanosheet or nanowire transistors having improved electrical performance and a method of forming the same.

Description of the Related Art

In recent years, advanced integrated circuit (IC) devices have become increasingly multifunctional and have been scaled down in size. Although the scaling down process generally increases production efficiency and lowers the associated costs, it has also increased the complexity of processing and manufacturing IC devices. For example, Fin Field-Effect Transistors (FinFETs) have been introduced to replace planar transistors. Among these FinFETs, gate-all-around (GAA) structures such as nanosheet or nanowire metal-oxide-semiconductor field-effect transistors (MOSFET) have been developed to possess excellent electrical characteristics, such as better power performance and area scaling compared to the current FinFET technologies.

Although existing semiconductor structures including nanosheet or nanowire transistors and methods for forming the same have been adequate for their intended purposes, they have not been entirely satisfactory in all respects. For example, in a semiconductor structure including nanosheet or nanowire transistors, each of the semiconductor stacks over the substrate includes the same number of channel layers over the substrate. However, it is disadvantageous that the semiconductor stack for forming a low-power device includes as many channel layers as the semiconductor stack for forming a high-power device does. Too many channel layers constructed in the semiconductor stack for forming the low-power device would lead to a considerable amount of leakage current while the device is in operation. Therefore, there are still some problems to be overcome in regards to semiconductor structures that include nanosheet or nanowire transistors in the semiconductor integrated circuits and technology.

BRIEF SUMMARY OF THE INVENTION

Some embodiments of the present disclosure provide semiconductor structures. An exemplary embodiment of a semiconductor structure includes a first semiconductor stack and a second semiconductor stack formed over the first region and the second region of a substrate, respectively. The first semiconductor stack and the second semiconductor stack extend in the first direction and are spaced apart from each other in the second direction. The second direction is different from the first direction. In some embodiments, each of the first semiconductor stack and the second semiconductor stack includes channel layers and a gate structure. In some embodiments, the channel layers are formed above the substrate and are spaced apart from each other in the third direction, wherein the third direction is vertical to the first direction and the second direction. In some embodiments, the gate structure includes gate dielectric layers formed around the respective channel layers, and a gate electrode layer formed on the gate dielectric layers to surround the channel layers. The number of channel layers in the first semiconductor stack is different from the number of channel layers in the second semiconductor stack.

Some embodiments of the present disclosure provide a method of forming a semiconductor structure. First, a structure is provided, including a fin structure over a substrate, and the fin structure includes a stack of alternating channel layers and sacrificial layers within the stack; a sacrificial gate structure over the fin structure; source/drain features on opposite sides of the sacrificial gate structure, and the source/drain features are adjacent to the channel layers in the fin structure; and an interlayer dielectric (ILD) layer over the substrate and covering the source/drain features and exposing the sacrificial gate structure. The method of forming the semiconductor structure also includes removing the sacrificial gate structure, and removing the sacrificial layers in the fin structure so that the channel layers in the fin structure are exposed. The method of forming the semiconductor structure further includes removing a portion of the exposed channel layers, and forming a gate structure around the remaining portions of the exposed channel layers.

Some embodiments of the present disclosure provide semiconductor structures. An exemplary embodiment of another semiconductor structure includes semiconductor stacks over a substrate, wherein each of the semiconductor stacks extends in the first direction, and adjacent semiconductor stacks are spaced apart from each other in the second direction. In some embodiments, one of the semiconductor stacks includes channel layers and a gate structure. The channel layers are formed above the substrate and are spaced apart from each other in the third direction, wherein the third direction is vertical to the first direction and the second direction. In some embodiments, the gate structure includes gate dielectric layers formed around the respective channel layers, and a gate electrode layer formed on the gate dielectric layers to surround the channel layers. Also, the first distance is defined as the distance in the third direction between the top surface of the gate structure of the semiconductor stack and the top surface of an uppermost channel layer in the semiconductor stack. The second distance is defined as the distance in the third direction between adjacent channel layers in the semiconductor stack. In some embodiments, the first distance is greater than 1.3 times the second distance. In some embodiments, the first distance is equal to or greater than 1.5 times the second distance. In some embodiments, the first distance is equal to or greater than 2.0 times the second distance.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2A, FIG. 3A, FIG. 4A and FIG. 5A are cross-sectional views taken along sectional line A-A of the semiconductor structure in FIG. 1.

FIG. 2B, FIG. 3B, FIG. 4B and FIG. 5B are cross-sectional views taken along sectional line B-B of the semiconductor structure in FIG. 1.

DETAILED DESCRIPTION OF THE INVENTION

Figure 1:
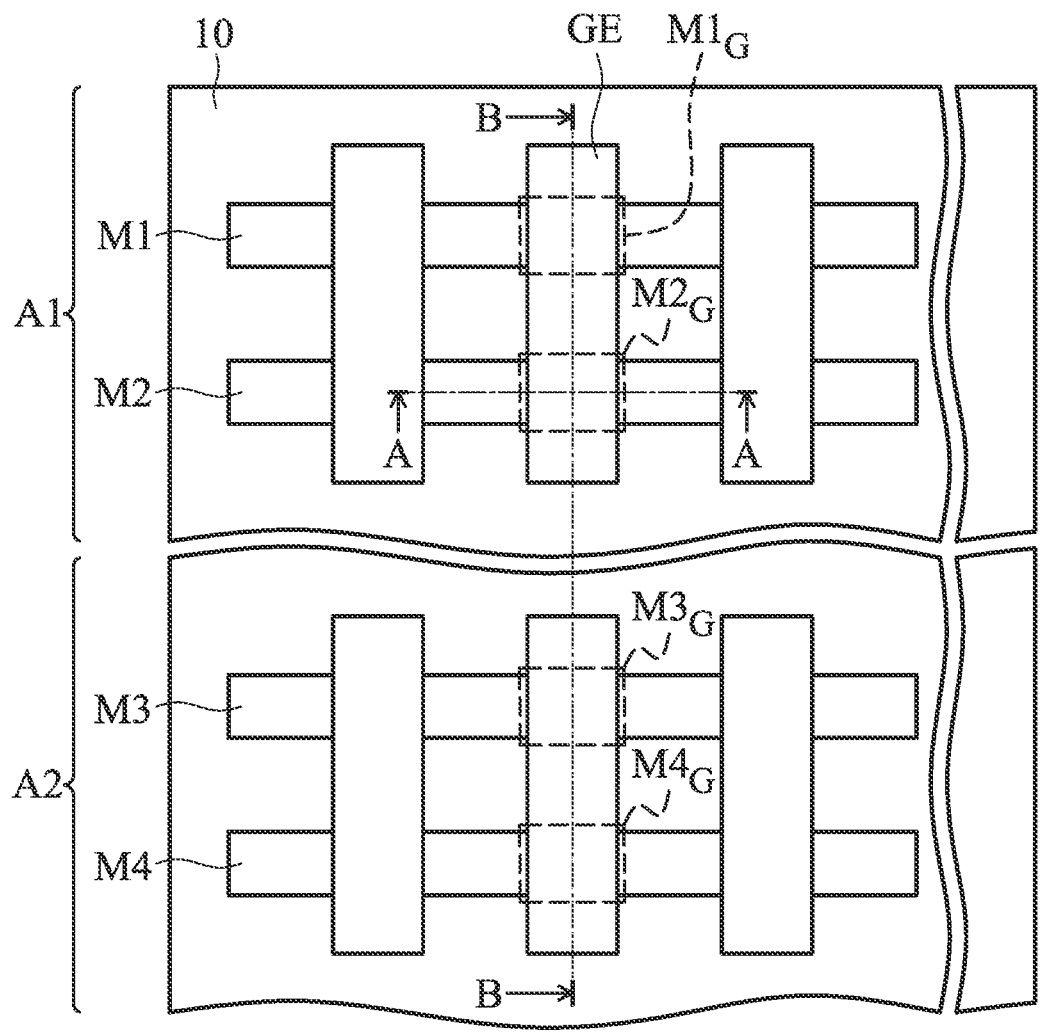
FIG. 1 is a top view of a semiconductor structure over a substrate.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected to or contacting the other element, or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Some embodiments of the disclosure are described. It should be noted that additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a top view of a semiconductor structure over a substrate. In some embodiments, the semiconductor structure is a three-dimensional or non-planar transistor. In some embodiments, the semiconductor structure is a fin field-effect transistor (FinFET) structure including several channel layers vertically stacked in one of the fin structures. Those channel layers may also be referred to as a multi-bridge channel, several nanoslabs, several nanosheets or several nanowires, depending on the dimensions of the channel layers. Also, the shape of a cross section of the wires may be round, square, hexagonal, or another shape.

Referring to FIG. 1, a semiconductor structure 1 includes a substrate 10 having the first region A1 and the second region A2. As shown in FIG. 1, several multilayered fins M1 and M2 are formed over the first region A1 of the substrate 10, and a gate structure GE is across the multilayered fins M1 and M2 to form semiconductor stacks $M1_G$ and $M2_G$ in the first region A1. Similarly, several multilayered fins M3 and M4 are formed over the second region A2 of the substrate 10, and another gate structure GE is across the multilayered fins M3 and M4 to form semiconductor stacks $M3_G$ and $M4_G$ in the second region A2.

To simplify the diagram, only two multilayered fins M1 and M2 over the first region A1 of the substrate 10 and two multilayered fins M3 and M4 over the second region A2 of the substrate 10 are depicted herein. The multilayered fins M1, M2, M3 and M4 may extend in the first direction D1 (such as X-direction), and the gate structures GE may extend in the second direction D2. In some embodiments, the semiconductor stacks $M1_G$ and $M2_G$ are nanosheet stacks or nanowire stacks, and each of the semiconductor stacks includes nanosheet or nanowire transistors. As shown in FIG. 1, adjacent multilayered fins M1 and M2 (or adjacent multilayered fins M3 and M4) are spaced apart from each other in the second direction D2 (such as Y-direction). The second direction D2 is different from the first direction D1, and may be perpendicular to the first direction D1.

It should be noted that the second region A2 may be adjacent to the first region A1 or away from the first region A1, depending on the design requirements of the application. In some embodiments, the first region A1 of the substrate 10 is provided for forming one or more transistors of the high-power devices, and the second region A2 is provided for forming one or more transistors of the low-power devices. According to some embodiments of the present disclosure, the numbers of channel layers in the semiconductor stacks over different regions of the same substrate can be different to meet the performance requirements of the devices formed on those regions. For example, the number of channel layers of a low-power device can be selectively reduced to decrease leakage current, thereby improving the electrical performance of the device.

According to some embodiments of the present disclosure, a semiconductor structure and a method of forming the same are described below, wherein the numbers of channel layers in the semiconductor stacks respectively over the first region and the second region can be different. In some embodiments, after the method of forming the semiconductor structure in some embodiments is performed, the semiconductor stack for forming a transistor of a low-power device may have N−1 or N−2 channel layers by removing one or more channel layers, while N channel layers in the semiconductor stack are kept for forming a transistor of a high-power device, wherein N is an positive integer equal to or greater than 3. Also, it should be noted that the present disclosure is not limited to the method provided herein. Those steps described below are merely for providing one example of the fabrication.

FIG. 2A, FIG. 2B, FIG. 3A, FIG. 3B, FIG. 4A, FIG. 4B, FIG. 5A, FIG. 5B, FIG. 6, FIG. 7, FIG. 8, FIG. 9, FIG. 10, FIG. 11, FIG. 12 and FIG. 13 are cross-sectional views of intermediate stages of a method for forming a semiconductor structure, in accordance with some embodiments. FIG. 2A, FIG. 3A, FIG. 4A and FIG. 5A are cross-sectional views taken along sectional line A-A of the semiconductor structure in FIG. 1. FIG. 2B, FIG. 3B, FIG. 4B and FIG. 5B are cross-sectional views taken along sectional line B-B of the semiconductor structure in FIG. 1.

Figure 2A:
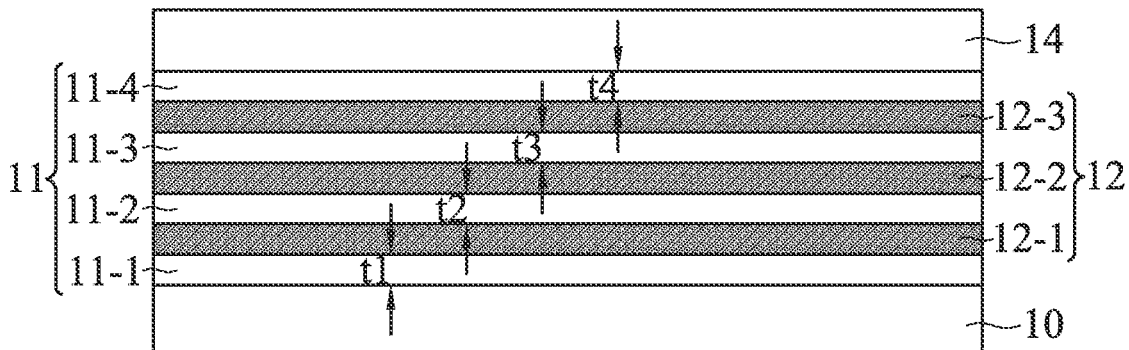
FIG. 2A, FIG. 2B, FIG. 3A, FIG. 3B, FIG. 4A, FIG. 4B, FIG. 5A, FIG. 5B, FIG. 6, FIG. 7, FIG. 8, FIG. 9, FIG. 10, FIG. 11, FIG. 12 and FIG. 13 are cross-sectional views of intermediate stages of a method for forming a semiconductor structure, in accordance with some embodiments.
Figure 2B:
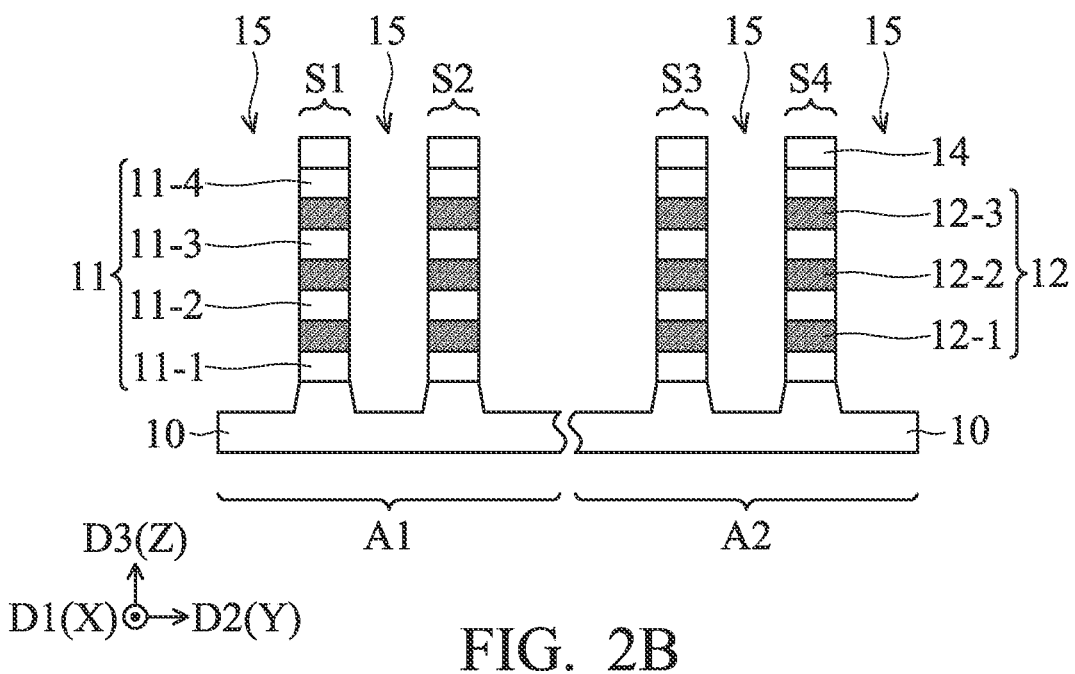

Referring to FIG. 2A and FIG. 2B, a substrate 10 is provided, and several semiconductor strips are formed over the substrate 10. In one embodiment, the semiconductor strips S1 and S2 are formed over the first region A1 of the substrate 10, and the semiconductor strips S3 and S4 are formed over the second region A2 of the substrate 10. The first region A1 is separated from the second region A2. Also, the adjacent semiconductor strips in the same region, such as the semiconductor strips S1 and S2 in the first region A1 and the semiconductor strips S3 and S4 in the second region A2, are spaced apart from each other in the second direction D2 (such as Y-direction). In some embodiments, each of the semiconductor strips S1, S2, S3 and S4 may include several sacrificial layers 11 and several channel layers 12 alternately formed on the substrate 10. The channel layers 12 of the semiconductor strips S1, S2, S3 and S4 are physically separated from the substrate 10, while the lowermost sacrificial layers 11 of the semiconductor strips S1, S2, S3 and S4 physically contact the substrate 10. Also, the spaces in the third direction D3 (such as Z-direction) between adjacent channel layers can be different or the same. For example, the space in the third direction D3 (such as Z-direction) between the two lowermost channel layers may be greater than the space between the two uppermost channel layers. In this embodiment, same spaces between adjacent channel layers 12 in the third direction D3 are depicted for illustration.

In some embodiments, the substrate 10 is a bulk semiconductor substrate, such as a semiconductor wafer. For example, the substrate 10 includes silicon or another elementary semiconductor material such as germanium. The substrate 100 may be un-doped or doped (e.g., p-type, n-type, or a combination thereof). In some embodiments, the substrate 10 includes an epitaxially grown semiconductor layer on a dielectric layer. The epitaxially grown semiconductor layer may be made of silicon germanium, silicon, germanium, one or more other suitable materials, or a combination thereof. In some other embodiments, the substrate 10 includes a multi-layered structure. For example, the substrate 10 includes a silicon-germanium layer formed on a bulk silicon layer.

The semiconductor strips S1, S2, S3 and S4 may be formed/patterned by any suitable method. The steps below are provided for describing one applicable method for forming the semiconductor strips S1, S2, S3 and S4. In some embodiments, several sacrificial layers 11 and several channel layers 12 are alternately deposited over the substrate 10, followed by depositing a patterned hard mask layer 14 on the uppermost sacrificial layer. Then, the sacrificial layers 11 and the channel layers 12 are patterned using the patterned hard mask layer 14, thereby forming the semiconductor strips S1, S2, S3 and S4 over the substrate 10. The patterned hard mask layer 14 may be a silicon nitride layer or a patterned layer formed by one or more other suitable materials. The semiconductor strips S1 and S2 over the first region of the substrate are separated by the first trench 15. Similarly, the semiconductor strips S3 and S4 over the second region of the substrate are separated by the first trench 15. In some embodiments, the semiconductor strips S1, S2, S3 and S4 extend in the first direction D1 (such as X-direction), as shown in FIG. 2A. Also, the semiconductor strips S1, S2, S3 and S4 are arranged along the second direction D2 (such as Y-direction), as shown in FIG. 2B. That is, the semiconductor strips S1 and S2 are spaced apart from each other in the second direction D2.

To simplify the diagram, three channel layers 12 (such as the first channel layer 12-1, the second channel layer 12-2 and the third channel layer 12-3) and four sacrificial layers 11 (such as the first sacrificial layer 11-1, the second sacrificial layer 11-2, the third sacrificial layer 11-3 and the fourth sacrificial layer 11-4) are depicted herein for illustrating the material layers of each of the semiconductor strips S1, S2, S3 and S4. Also, although two semiconductor strips S1, S2, S3 and S4 are depicted herein to simplify the diagram of the embodiment, more semiconductor strips may be formed on the substrate 10, and adjacent two semiconductor strips are separated by the first trench 15.

Also, as shown in FIG. 2B, in each of the semiconductor strips S1, S2, S3 and S4, the channel layers 12 (such as the first channel layer 12-1, the second channel layer 12-2 and the third channel layer 12-3) above the substrate 10 are spaced apart from each other in the third direction D3 (such as Z-direction). The third direction D3 is vertical to the first direction D1 and the second direction D2. In some embodiments, the space between the first channel layer 12-1 and the second channel layer 12-2 is substantially equal to the space between the second channel layer 12-2 and the third channel layer 12-3.

Specifically, as shown in FIG. 2B, the first sacrificial layer 11-1, the second sacrificial layer 11-2, the third sacrificial layer 11-3 and the fourth sacrificial layer 11-4 have the thicknesses t1, t2, t3 and t4, respectively. In some embodiments, the first space is defined as the distance in the third direction D3 between the first channel layer 12-1 and the second channel layer 12-2 (e.g. the two lowermost channel layers in this example), and the first space is identical to the thickness t2 of the second sacrificial layer 11-2. In some embodiments, the second space is defined as the distance in the third direction D3 between the second channel layer 12-2 and the third channel layer 12-3 (e.g. the two uppermost channel layers in this example), and the second space is identical to the thickness t3 of the third sacrificial layer 11-3. According to some embodiments of the present disclosure, the first space (e.g. equal to the thickness t2) is substantially equal to the second space (e.g. equal to the thickness t3) (t2=t3). In addition, the thickness t1 of the first sacrificial layer 11-1 may be substantially equal to the thickness t2 of the second sacrificial layer 11-2, and the thickness t4 of the fourth sacrificial layer 11-4 may be equal to the thickness t3 of the third sacrificial layer 11-3.

In some embodiments, each of the channel layers 12 of the semiconductor strips S1, S2, S3 and S4 include one or more elements selected from group IV semiconductor materials, such as Si (intrinsic Si or lightly doped Si), Ge (intrinsic Ge or lightly doped Ge), SiGe, or a compound including Sn or Pb. In some embodiments, the channel layers 12 include a compound formed by elements selected from group III-V semiconductor materials, such as GaAs, InAs or InSb. It should be noted that the channel layer 12 of the present disclosure is not limited to include the aforementioned materials.

In addition, the channel layers 12 in one of the semiconductor strips are made of the same material or the same compound with the same molar ratio of two or more elements. In some embodiments, the channel layers 12 in one semiconductor strip are made of silicon (Si). In some other embodiments, the channel layers 12 in one semiconductor strip are made of silicon germanium, wherein the molar ratios of silicon and germanium in each of the channel layers 12 are identical. For example, the channel layers 12 in one semiconductor strip are formed by $Si_{(1-x)}Ge_x$, $Si_{(1-y)}Ge_y$, $Si_{(1-z)}Ge_z$, wherein x=y=z. Also, the sacrificial layers 11 can be formed by a different material than the channel layers 12, and will be removed in a later process. In this embodiment, the channel layers 12 are made of silicon (Si), and the sacrificial layers 11 are made of silicon germanium (SiGe).

Figure 3A:
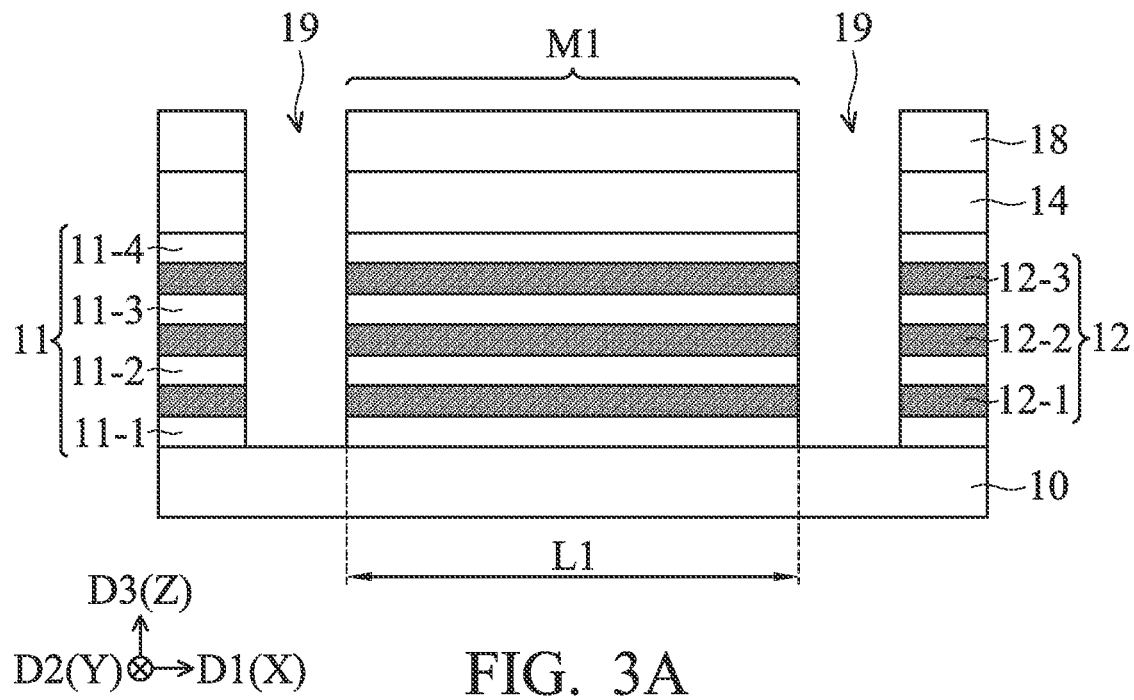
Figure 3B:
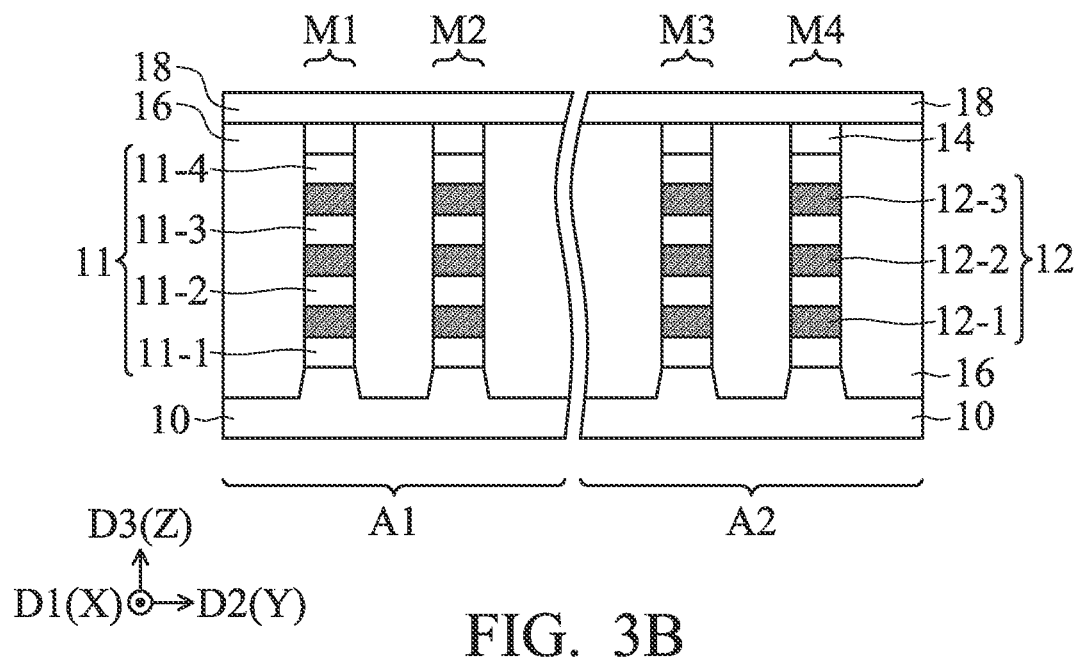

Next, referring to FIG. 3A and FIG. 3B, in some embodiments, an insulating layer 16 is deposited over the semiconductor strips S1, S2, S3 and S4, and fills the first trenches 15 between the semiconductor strips S1 and S2 and the semiconductor strips S3 and S4. A planarization process, such as a chemical mechanical polishing (CMP) process, is performed to remove the excess portion of the insulating layer 16 above the patterned hard mask layer 14. Then, a patterned mask 18 can be formed on the patterned hard mask layer 14 and the insulating layer 16. The semiconductor strips S1, S2, S3 and S4 can optionally be patterned to form the second trenches 19, thereby defining several multilayered fins covered by the patterned mask 18. The number of multilayered fins depends on design requirements. As shown in FIG. 3A, two second trenches 19 extending in the second direction D2 define three multilayered fins in each of the first region A1 and the second region A2, and one multilayered fin M1 with a full width in the first direction D1 is shown in FIG. 3A to simplify the diagram of the embodiment. As shown in FIG. 3B, the patterned mask 18 is formed on the multilayered fins M1 and M2 in the first region A1, and the multilayered fins M1 and M2 are spaced apart from each other in the second direction D2 (such as Y-direction). The patterned mask 18 is also formed on the multilayered fins M3 and M4 in the second region A2, and the multilayered fins M3 and M4 are spaced apart from each other in the second direction D2.

In some embodiments, the patterned mask 18 may include an organic planarizing layer, an anti-reflective coating (ARC) film, a photoresist layer, or other suitable materials. The patterned mask 18 can be applied in different layout configurations to define the number and the lengths of multilayered fins M1, M2, M3 and M4. The length L1 of the multilayered fin M1 in the first direction D1 is shown in FIG. 3A.

To form nanosheet or nanowire transistors of the semiconductor structure in accordance with some embodiments of the present disclosure, the sacrificial layers 11 in the multilayered fins have to be removed, followed by forming a gate structure across selected multilayered fins and wrapping around the channel layers in the selected multilayered fins.

One of the applicable processes (i.e. FIG. 4A, FIG. 4B, FIG. 5A, FIG. 5B, FIG. 6, FIG. 7 and FIG. 8) is provided below for exemplifying the removal of the sacrificial layers 11 in the multilayered fins.

Figure 4A:
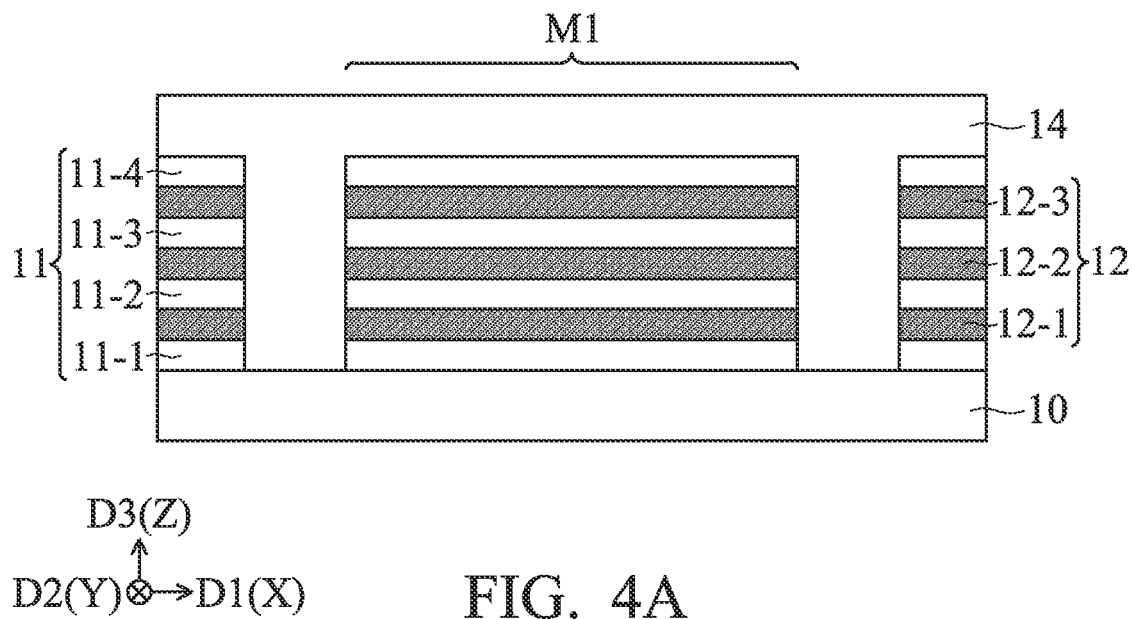
Figure 4B:
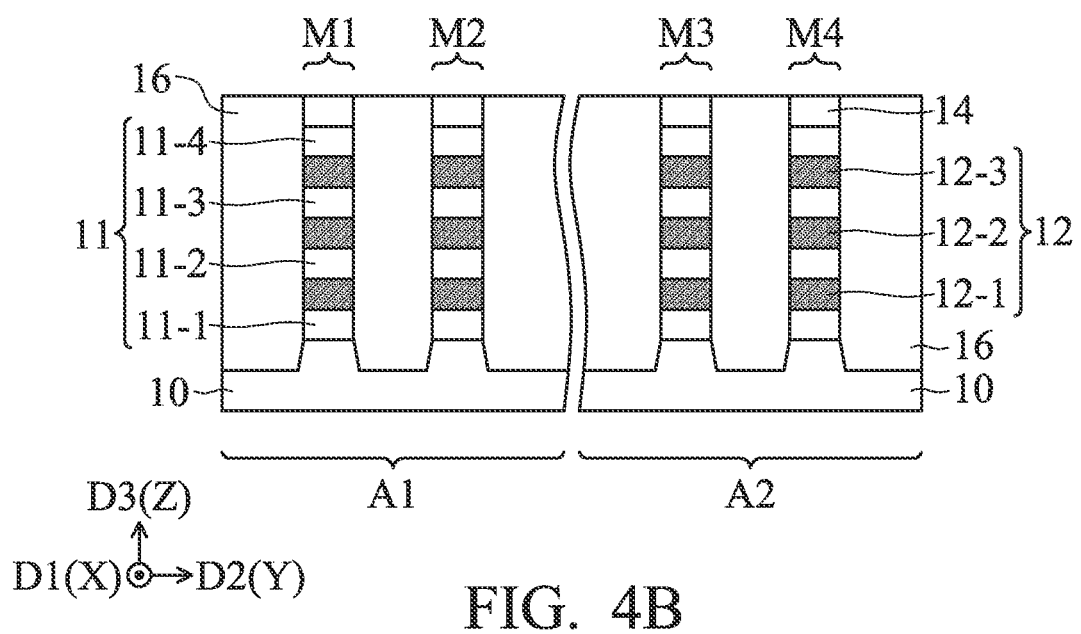

Referring to FIG. 4A and FIG. 4B, in some embodiments, the patterned mask 18 is removed, and the material of the patterned hard mask layer 14 is deposited on the multilayered fins M1, M2, M3 and M4 and fills the second trenches 19. A planarization process, such as a chemical mechanical polishing (CMP) process, can be performed to remove the excess portion of the patterned hard mask layer 14 above the insulating layer 16, thereby exposing the insulating layer 16. As shown in FIG. 4B, the insulating layer 16 filling the first trenches 15 is exposed between the multilayered fins M1 and M2 arranged separately in the second direction D2 after polishing the patterned hard mask layer 14.

Figure 5A:
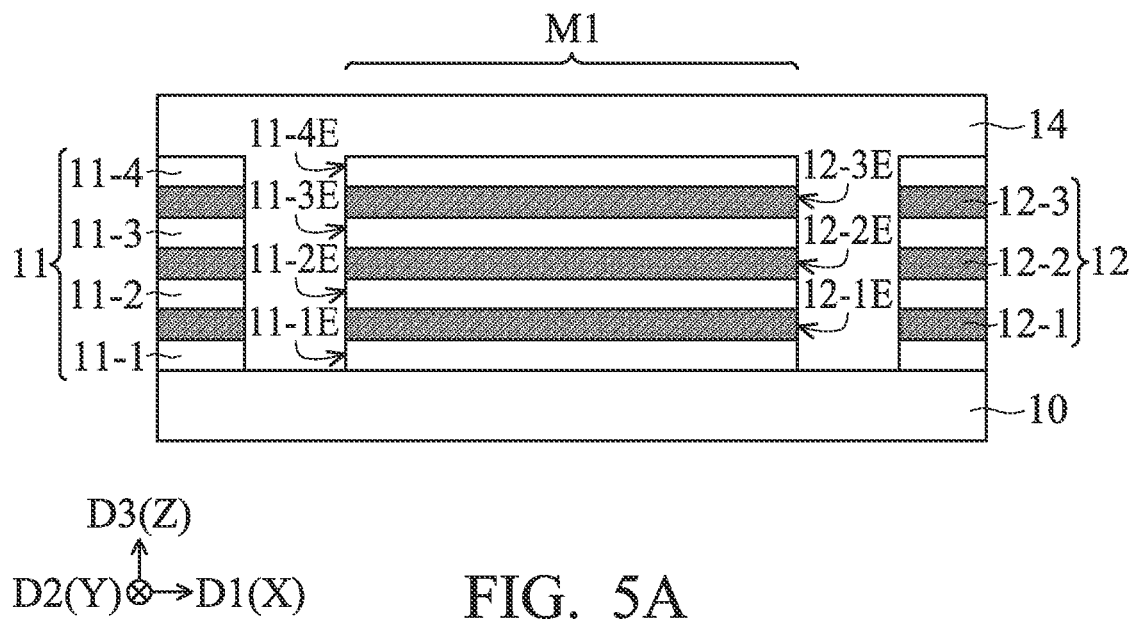
Figure 5B:
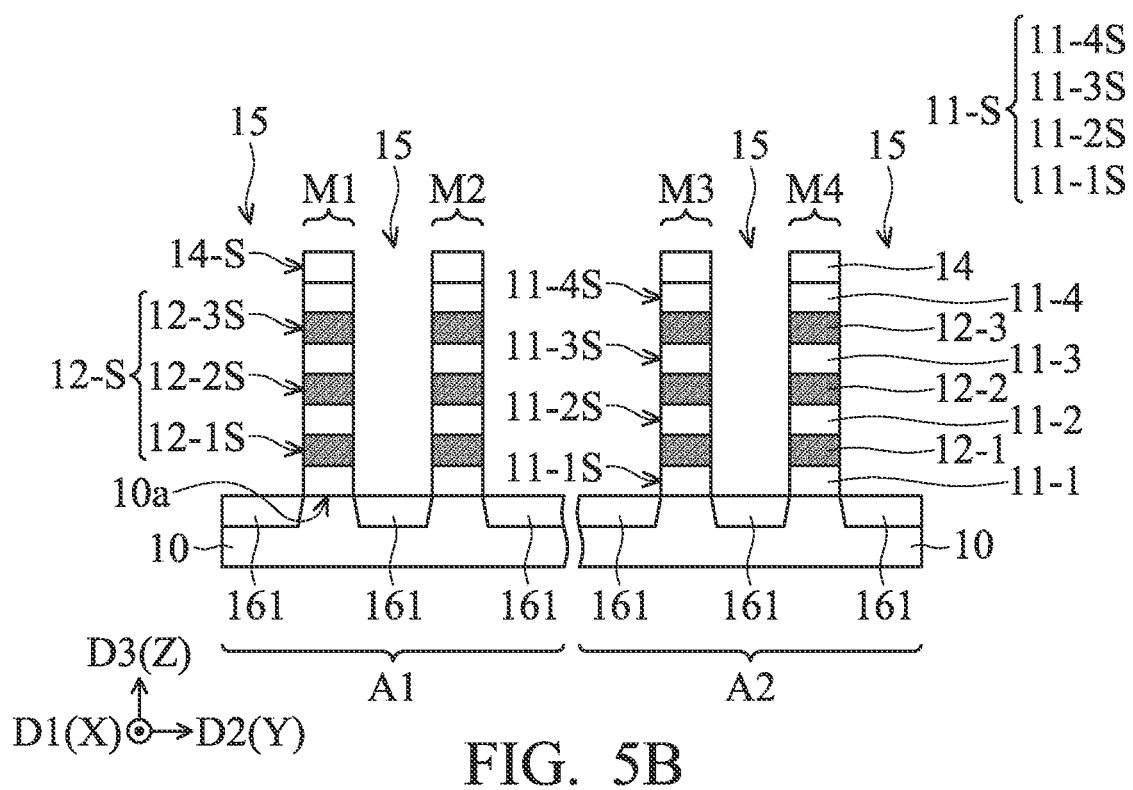

Next, referring to FIG. 5A and FIG. 5B, in some embodiments, the insulating layer 16 in the first trenches 15 is recessed, and the remaining portions of the insulating layer 16 form isolation features (such as shallow trench isolations, STI) 161 between adjacent two of the multilayered fins M1, M2, M3 and M4. After the insulating layer 16 is recessed, opposite sidewalls of the sacrificial layers 11 and opposite sidewalls of the channel layers 12 of the multilayered fins M1, M2, M3 and M4 are exposed in the first trenches 15 (FIG. 5B), and the other two opposite sidewalls of the sacrificial layers 11 and the channel layers 12 of the multilayered fins M1 and M2 are covered by the material of the patterned hard mask layer 14 filling in the second trenches 19.

For example, as shown in FIG. 5B, in the multilayered fins M1 and M2 over the first region A1 of the substrate 10, the sidewalls 11-1S of the first sacrificial layer 11-1, the sidewalls 12-1S of the first channel layer 12-1, the sidewalls 11-2S of the second sacrificial layer 11-2, the sidewalls 12-2S of the second channel layer 12-2, the sidewalls 11-3S of the third sacrificial layer 11-3, the sidewalls 12-3S of the third channel layer 12-3, the sidewalls 11-4S of the fourth sacrificial layer 11-4 and the sidewalls 14-S of the patterned hard mask layer 14 are revealed by the first trenches 15. Also, take the multilayered fin M1 as an example, the sidewalls 11-1E of the first sacrificial layer 11-1, the sidewalls 12-1E of the first channel layer 12-1, the sidewalls 11-2E of the second sacrificial layer 11-2, the sidewalls 12-2E of the second channel layer 12-2, the sidewalls 11-3E of the third sacrificial layer 11-3, the sidewalls 12-3E of the third channel layer 12-3 and the sidewalls 11-4E of the fourth sacrificial layer 11-4 are covered by the material of the patterned hard mask layer 14 filling in the second trenches 19, as shown in FIG. 5A. That is, two opposite sidewalls (e.g. the sidewalls 12-1E, 12-2E and 12-3E) of the channel layers 12 of the multilayered fins M1 and M2 are secured (or anchored) by the material of the patterned hard mask layer 14 in the second trenches 19.

Figure 6:
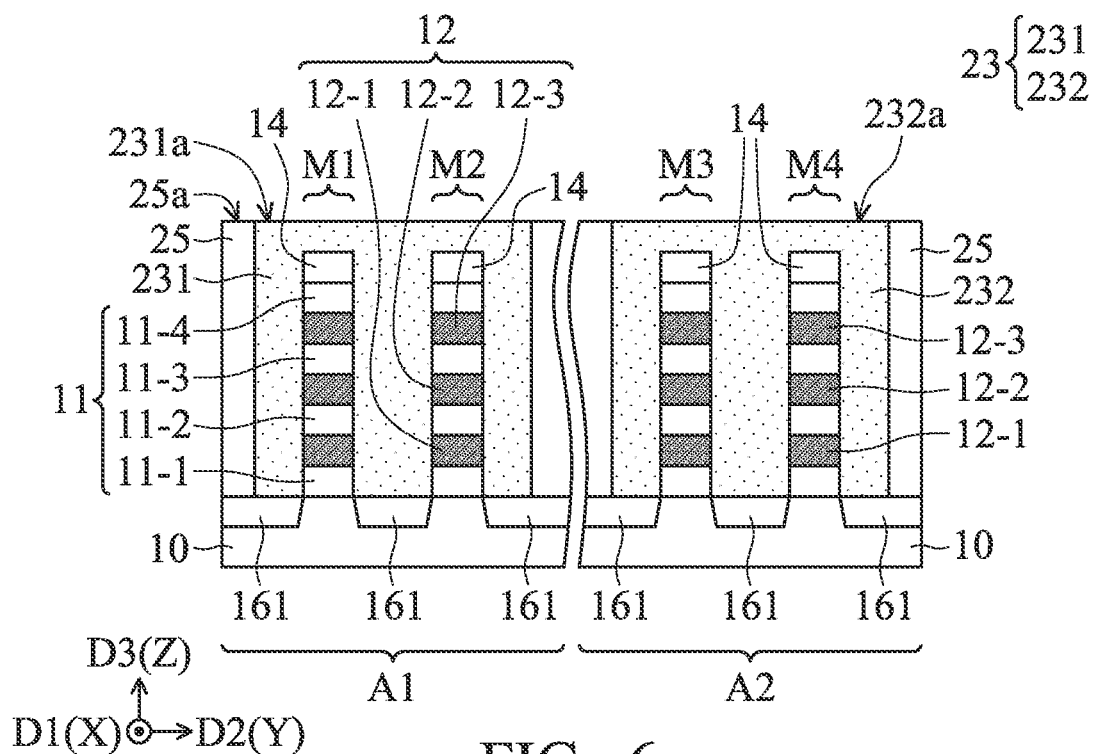

Referring to FIG. 6, a structure with sacrificial gate structures 23 and an ILD layer 25 is then provided. In some embodiments, after forming the multilayered fins M1, M2, M3 and M4 shown in FIG. 5B, each of the sacrificial gate structures 23 (such as the first sacrificial gate structure 231 over the first region A1 and the second sacrificial gate structure 232 over the second region A) is formed across selected multilayered fins and around three surfaces of the multilayered fins over the respective region of the substrate 10. In some embodiments, the sacrificial gate structures 23 extend in the second direction D2 and across one or more multilayered fins (e.g. two multilayered fins in each of the first region A1 and the second region A2). In some embodiments, each of the sacrificial gate structures 23 may include silicon (such as polysilicon) or other suitable materials. The sacrificial gate structure can be a single layer or a multi-layered structure. Subsequently, source/drain (S/D) features (not shown in FIG. 6) (e.g. the source/drain (S/D) features 235 and 236 shown in FIG. 14) are formed on opposite sides of the sacrificial gate structures 23, and an interlayer dielectric (ILD) material is deposited to cover the S/D features and the sacrificial gate structures 23, and then partially removed to expose the sacrificial gate structures 23 and form the ILD layer 25, thereby forming the structure of FIG. 6. In some embodiments, details of a method for forming the structure of FIG. 6 are described below.

In some embodiments, after the sacrificial gate structures 23 are formed in the first region A1 and the second region A2, the portions of the multilayered fins M1, M2, M3 and M4 that are uncovered by the sacrificial gate structures 23 (i.e. corresponding to regions for forming source/drain features) are recessed down below the upper surface of the isolation features (such as STI) 161, by using dry etching and/or wet etching.

Figure 14:
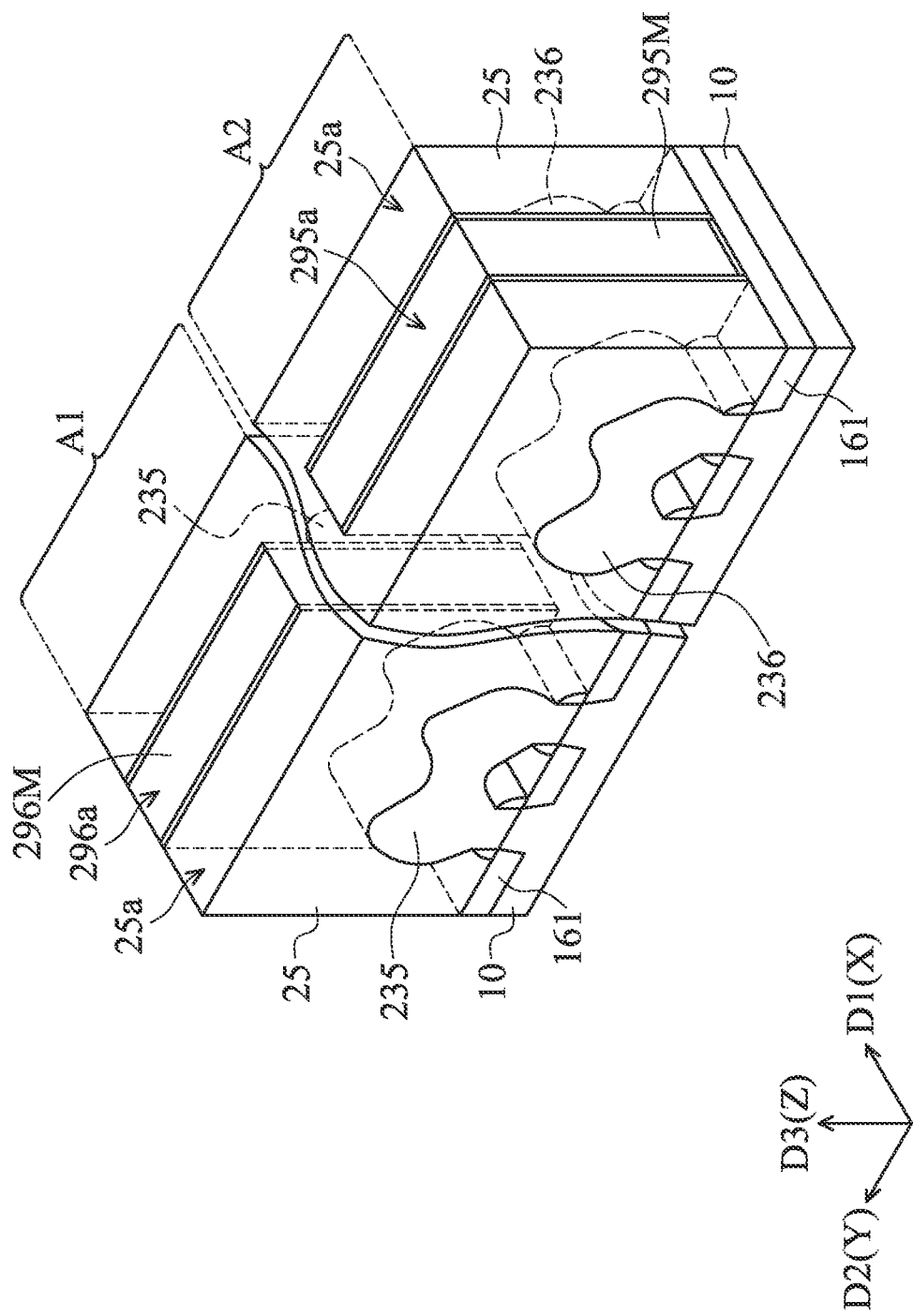
FIG. 14 is a perspective view of a semiconductor structure of FIG. 13, in accordance with some embodiments.

Then, the source/drain (S/D) features (not shown in FIG. 6)(e.g. the source/drain (S/D) features 235 and 236 shown in FIG. 14) are grown on the recessed surfaces of the multilayered fins. In each of the first region A1 and the second region A2, the source/drain (S/D) features are formed on opposite sides of the sacrificial gate structure 23, and the source/drain features are adjacent to the channel layers 12 of the multilayered fins covered by the sacrificial gate structure 23. In some embodiments, the source/drain (S/D) features includes one or more layers of Si, SiP, SiC and SiCP for an n-channel FET or Si, SiGe, Ge for a p-channel FET. In some embodiments, the source/drain (S/D) features are formed by an epitaxial growth method using CVD, ALD or molecular beam epitaxy (MBE).

Subsequently, an interlayer dielectric material is deposited to cover the S/D features and the sacrificial gate structures 23 in the first region A1 and the second region A2. Then, the interlayer dielectric material is partially removed by any suitable planarization process, such as CMP, to form an ILD layer 25, wherein the sacrificial gate structures 23 are exposed. As shown in the structure of FIG. 6, after the ILD layer 25 is formed, the top surfaces of the sacrificial gate structures 23 is substantially level with the top surface of the ILD layer 25, in accordance with some embodiments. The materials for the ILD layer 25 may include compounds of Si, O, C and/or H. In some embodiments, the ILD layer 25 includes silicon oxide, SiCOH, SiOC, and a combination thereof. Organic materials, such as polymers, may be used for the ILD layer 25.

In some embodiments, as shown in the structure of FIG. 6, the multilayered fins M1 and M2 covered by the sacrificial gate structure 23 can be referred to as first fin structures M1 and M2 over the first region A1 of the substrate 10, wherein this sacrificial gate structure 23 over the first fin structures M1 and M2 in the first region A1 can be referred to as the first sacrificial gate structure 231. Each of the first fin structures M1 and M2 includes a first stack (also referred to as a first semiconductor stack) of alternating channel layers 12 and sacrificial layers 11 within the first stack. Also, the source/drain features in the first region A1 (not shown in FIG. 6) can be referred to as first source/drain features on opposite sides of the first sacrificial gate structure 231 and adjacent to the channel layers 12 of at least one of the first fin structures M1 and M2.

Similarly, the multilayered fins M3 and M4 covered by another sacrificial gate structure 23 can also be referred to as second fin structures M3 and M4 over the second region A2 of the substrate 10, wherein this sacrificial gate structure 23 over the second fin structures M3 and M4 in the second region A2 can be referred to as the second sacrificial gate structure 232. Each of the second fin structures M3 and M4 includes a second stack (also referred to as a second semiconductor stack) of alternating channel layers 12 and sacrificial layers 11 within the second stack. Also, the source/drain features in the second region A2 (not shown in FIG. 6) can be referred to as second source/drain features on opposite sides of the second sacrificial gate structure 232 and adjacent to the channel layers 12 of at least one of the second fin structures M3 and M4. Although each of the sacrificial gate structures (or metal gate structures formed in the subsequent processes) is formed over two fin structures, the disclosure is not limited to the exemplified embodiment. In some other embodiments, a sacrificial gate structure (or a metal gate structure formed in the subsequent processes) can be formed over one fin structure, or over several fin structures such as three or more than three fin structures, depending on the design requirements.

In some embodiments, the interlayer dielectric (ILD) layer 25 covers the first source/drain features (e.g. 235 in FIG. 14) and the second source/drain features (e.g. 236 in FIG. 14), and the first sacrificial gate structure 231 and the second sacrificial gate structure 232 are exposed. As shown in FIG. 6, the top surface 231a of the first sacrificial gate structure 231 and the top surface 232a of the second sacrificial gate structure 232 are substantially level with the top surface 25a of the ILD layer 25.

Figure 7:
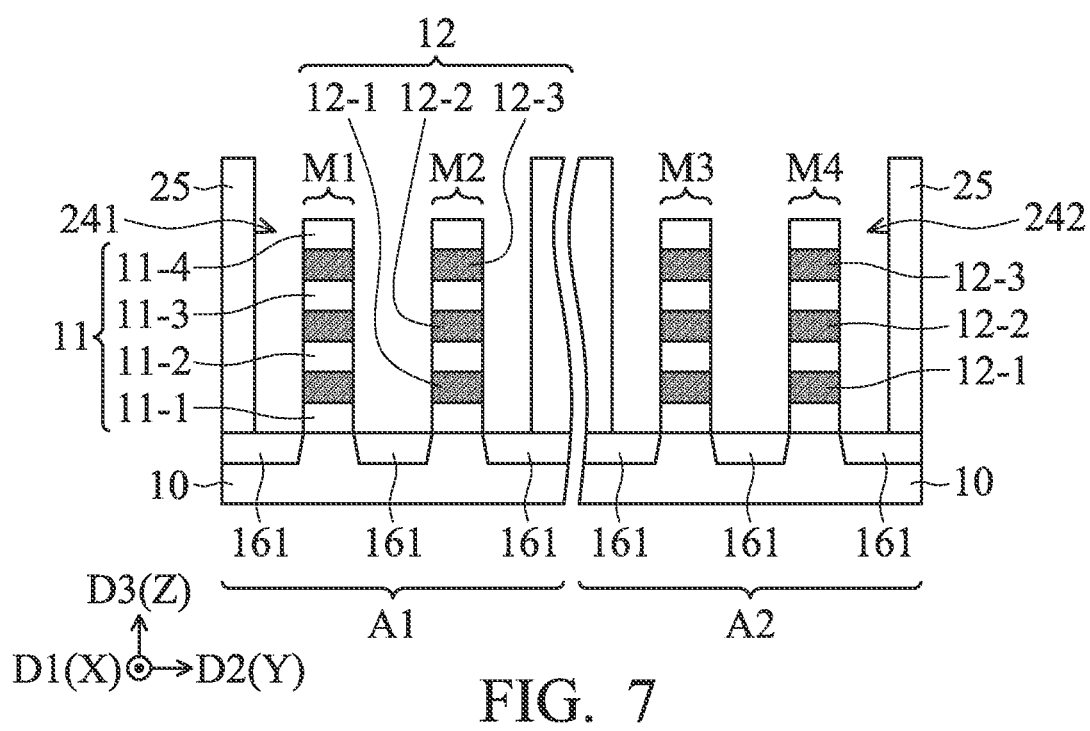

As shown in FIG. 7, the sacrificial gate structures 23 are removed. In some embodiments, the first sacrificial gate structure 231 and the second sacrificial gate structure 232 are removed to form the first space 241 and the second space 242, respectively. In some embodiments, the first sacrificial gate structure 231 over the first fin structures M1 and M2 and the second sacrificial gate structure 232 over the second fin structures M3 and M4 are removed in the same removing process. As shown in FIG. 7, after the sacrificial gate structures 23 are removed, the first fin structures M1 and M2 are exposed in the first space 241, and the second fin structures M3 and M4 are exposed in the second space 242, in accordance with some embodiments.

Figure 8:
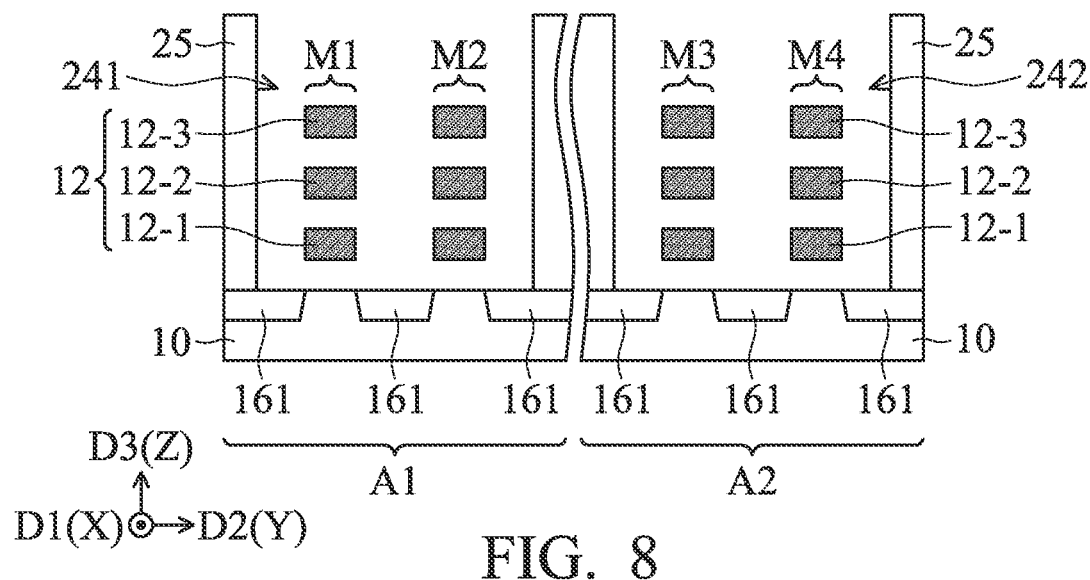

As shown in FIG. 8, the sacrificial layers 11 of the fin structures are removed, so that the channel layers 12 of the fin structures are exposed. This step of removing the sacrificial layers 11 may also be referred to as a wire release step or a sheet formation step (e.g. nanosheet formation step). In some embodiments, the sacrificial layers 11 (including the first sacrificial layer 11-1, the second sacrificial layer 11-2, the third sacrificial layer 11-3 and the fourth sacrificial layer 11-4) of each of the first fin structures M1, M2 and the second fin structures M3, M4 are removed in the same removing process. The sacrificial layers 11 can be removed using an isotropic dry or wet etching process that is selective to the channel layers 12.

In FIG. 8, the channel layers 12 in the first fin structures M1, M2 and the second fin structures M3, M4 appear to be floating. However, the material of the patterned hard mask layer 14 in the second trenches 19 secure two ends of the channel layers 12.

According to some embodiments of the disclosure, after the sacrificial gate structures (e.g. the first sacrificial gate structure 231 and the second sacrificial gate structure 232) and the sacrificial layers 11 (such as the SiGe layers) have been removed, the numbers of the channel layers in the fin structures in different regions can be selectively reduced, by removing a portion of the exposed channel layers (e.g. one or more exposed channel layers) of the fin structures in one or more regions. Accordingly, the number of channel layers of one or more fin structures can meet the requirements of operation conditions, thereby reducing leakage current and improving electrical performance of the semiconductor device. One of the applicable processes (such as steps in FIG. 9, FIG. 10 and FIG. 11) is provided below for exemplifying the reduction in the number of channel layers of one or more fin structures that form transistors of one or more low-power devices over certain region(s) of the substrate 10 in the subsequent processes.

Figure 9:
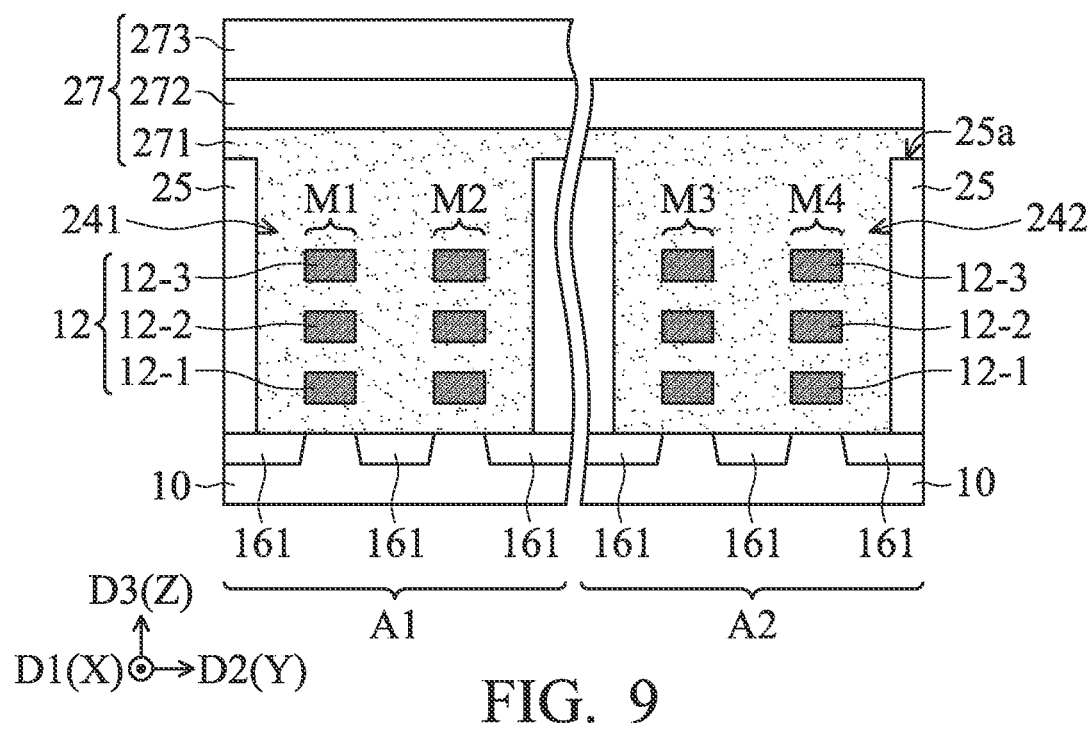

Referring to FIG. 9, according to some embodiments, a mask layer 27 is formed over the substrate 10. In some embodiments, the mask layer 27 includes the first material layer 271, the second material layer 272 on the first material layer 271, and the third material layer 273 on the second material layer 272. The first material layer 271 fully filling the first space 241 and the second spaces 242 that are formed by removing the first sacrificial gate structure 231 and the second sacrificial gate structure 232, respectively. As shown in FIG. 9, the first material layer 271 covers the exposed channel layers 12 of the first stacks and the second stacks over the respective first region A1 and the second region A2. The second material layer 272 is conformally formed on the first material layer 271. The second material layer 272 also shields the first stacks of the first fin structures M1 and M2 over the first region A1, and shields the second stacks of the second fin structures M3 and M4 over the second region A2. The third material layer 273 includes a pattern for exposing a portion of the second material layer 272 over the second region A2 of the substrate 10. Subsequently, the pattern of the third material layer 273 is transferred to the second material layer 272, thereby exposing the portion of the first material layer 271 that covers the exposed channel layers 12 of the second stacks of the second fin structures M3 and M4 over the second region A2.

In some embodiments, the first material layer 271 includes one or more organic materials with good fluidity, or another suitable material. The second material layer 272 on the first material layer 271 may include a hard mask layer, such as a silicon nitride layer or another suitable material layer. The second material layer 272 protects the underlying first material layer 271. The third material layer 273 on the second material layer 272 may include a photoresist layer, or another suitable material.

Figure 10:
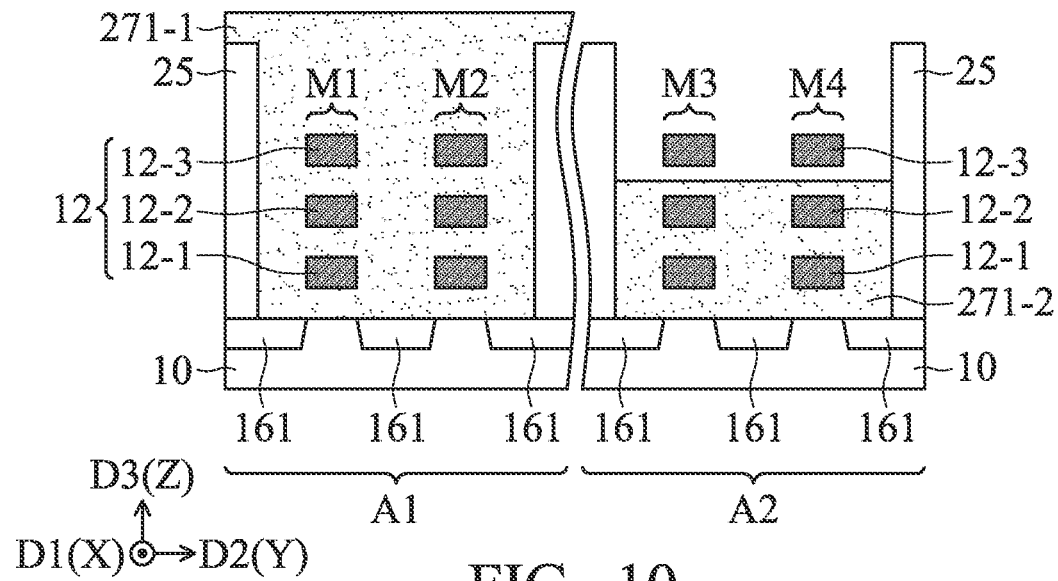

Referring to FIG. 10, according to some embodiments, the portion of the first material layer 271 that covers the exposed channel layers 12 of the second stacks over the second region A2 is partially removed, thereby exposing one or more channel layers 12 of the second stacks over the second region A2. Then, the third material layer 273 and the second material layer 272 are removed.

In this embodiment, the uppermost channel layers in the second stacks of the second fin structures M3 and M4 over the second region A2 are exposed. As show in FIG. 10, the portion 271-1 of the first material layer 271 fills up the first space 241 over the first region A1 and fully covers the channel layers 12 of the first stacks of the first fin structures M1 and M2. The remaining portion 271-2 of the first material layer 271 in the second space 242 over the second region A2 exposes the uppermost channel layer (such as the third channel layers 12-3) and covers the remained channel layers (such as the first channel layers 12-1 and the second channel layers 12-2) of the second stacks of the second fin structures M3 and M4.

Figure 11:
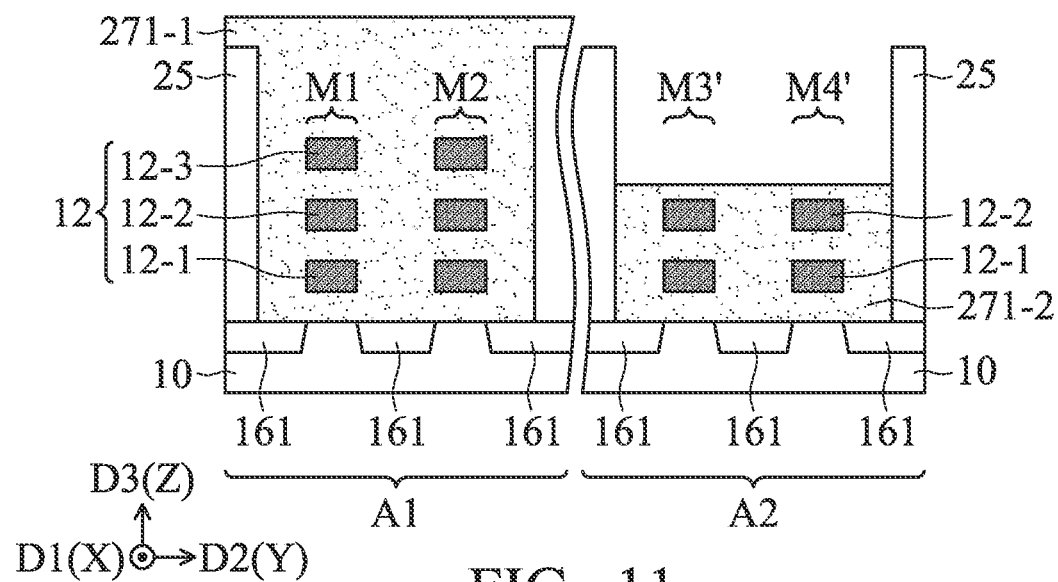

Referring to FIG. 11, according to one embodiment, the exposed uppermost channel layers (such as the third channel layers 12-3) of the second stacks of the second fin structures M3 and M4 over the second region A2 are removed. In some embodiments, the exposed uppermost channel layer can be removed using a dry or wet etching process that is selective to the first material layer 271. After the number of channel layers is reduced, each of the second stacks of the second fin structures M3' and M4' includes two channel layers, as shown in FIG. 11.

After the reduction in the number of channel layers in the selected stacks of the fin structures over one or more certain regions is performed, the first material layer 271, including the portion 271-1 filling up the first space 241 over the first region A1 and the remaining portion 271-2 in the second space 242 over the second region A2, is removed.

After the first material layer 271 is removed, a gate structure is formed around the remaining portions of the exposed channel layers in the fin structures over the substrate 10, such as the first fin structures M1 and M2 over the first region A1 and the second fin structures M3' and M4' over the second region A2. In some embodiments, each of the gate structures includes a gate dielectric layer 28 and a gate electrode GE.

Figure 12:
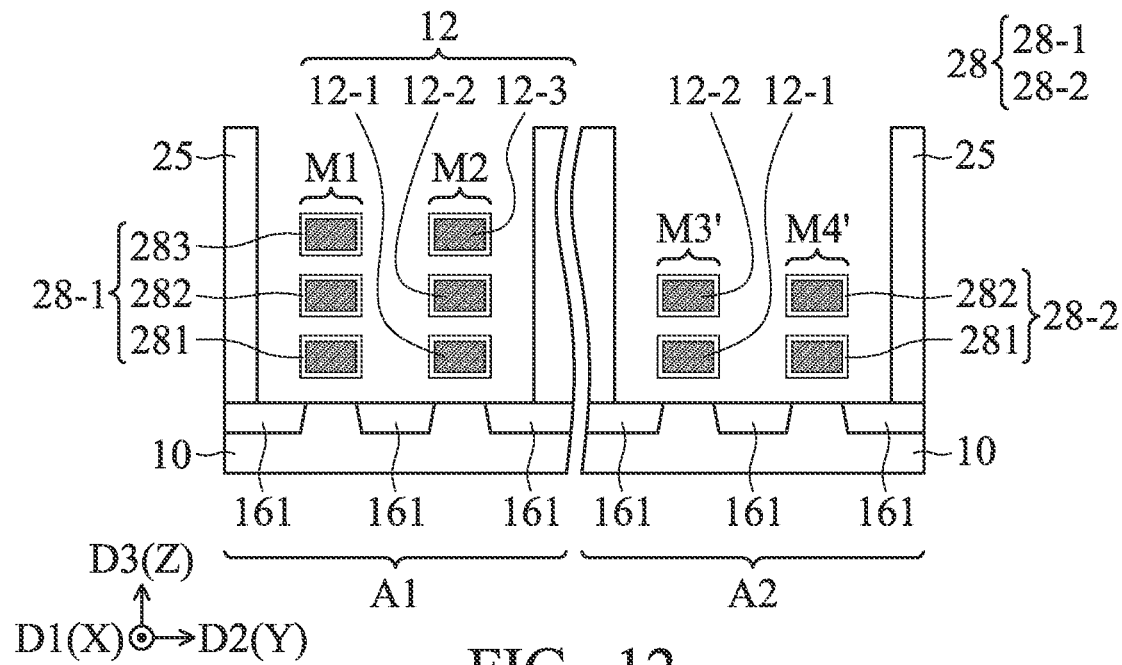

Referring to FIG. 12, according to some embodiments, the gate dielectric layers 28 are formed for surrounding the respective channel layers 12. Specifically, as shown in FIG. 12, the gate dielectric layers 281, 282 and 283 (that collectively form the first gate dielectric layer 28-1) are formed on two opposite sidewalls, the top surfaces and the bottom surfaces of the channel layers 12-1, 12-2 and 12-3 of the first fin structures M1 and M2 over the first region A1, respectively. Also, the gate dielectric layers 281 and 282 (that collectively form the second gate dielectric layer 28-2) are formed on two opposite sidewalls, the top surfaces and the bottom surfaces of the channel layers 12-1 and 12-2 of the second fin structures M3' and M4' over the second region A2, respectively.

In some embodiments, each of the gate dielectric layers 281, 282 and 283 includes one or more high-k dielectric materials, such as the dielectric materials with a dielectric constant (k) greater than that of silicon dioxide, wherein the dielectric constant of silicon dioxide is about 3.7 to 3.9.

Figure 13:
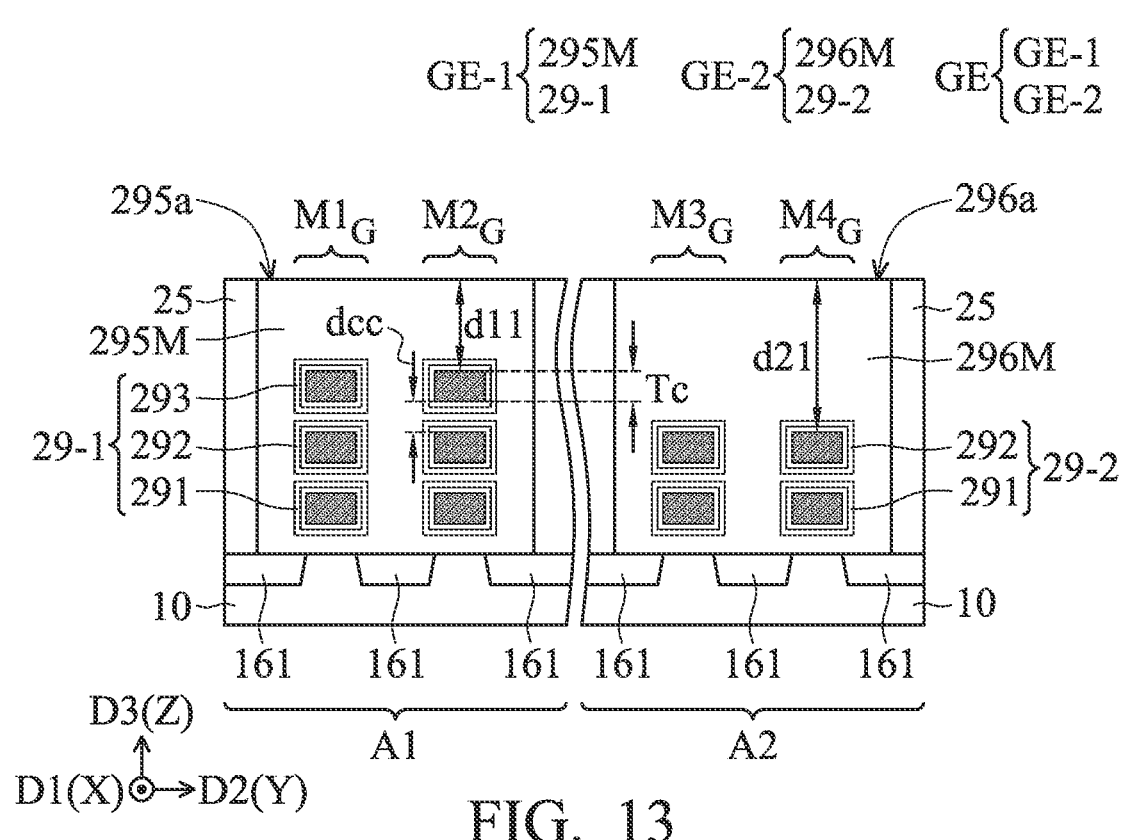

Referring to FIG. 13, according to some embodiments, the first gate electrodes GE-1 and the second gate electrodes GE-2 (collectively form a gate electrode GE) fill the first space 241 over the first region A1 and the second space 242 over the second region A2, respectively. Each of the first gate electrodes GE-1 and the second gate electrodes GE-2 is formed at least on the sidewalls, the top surfaces and the bottom surfaces of the gate dielectric layers 281, 282 and 283. Also, after the first gate electrodes GE-1 and the second gate electrodes GE-2 are formed, the first fin structures M1 and M2 and the first gate electrodes GE-1 on the first fin structures M1 and M2 over the first region A1 can be referred to as first semiconductor stacks $M1_G$ and $M2_G$. Similarly, the second fin structures M3' and M4' and the second gate electrodes GE-2 on the second fin structures M3' and M4' over the second region A2 can be referred to as second semiconductor stacks $M3_G$ and $M4_G$.

According to the embodiments of the present disclosure, each of the first gate structures may include the first gate dielectric layer 28-1 and the first gate electrodes GE-1. Each of the second gate structures may include the second gate dielectric layer 28-2 and the second gate electrodes GE-2. In some embodiments, the gate electrode of the gate structures may not include a work function tuning layer. However, in some other embodiments, the gate electrodes may include work function tuning layers (e.g. 29-1 and 29-2 shown in FIG. 13) and metal filling layers (e.g. 295M and 296M shown in FIG. 13).

FIG. 13 is a cross-sectional view of a semiconductor structure in accordance with some embodiments, which depicts the work function tuning layers 29-1 (including the work function tuning layers 291, 292 and 293 over the first region A1) and 29-2 (including the work function tuning layers 291 and 292 over the second region A2) surrounding the gate dielectric layers 28-1 and 28-2, respectively. FIG. 13 also depicts the metal filling layers 295M and 296M around the work function tuning layers 29-1 and 29-2, respectively.

Each of the first gate structures may include the first gate dielectric layer 28-1 and the first gate electrodes GE-1. The first gate electrode GE-1 may include the metal filling layer 295M, or a combination of the work function tuning metal layer 29-1 and the metal filling layer 295M, as shown in FIG. 13. Similarly, each of the second gate structures may include the second gate dielectric layer 28-2 and the second gate electrodes GE-2. The second gate electrode GE-2 may include the metal filling layer 296M, or a combination of the work function tuning metal layer 29-2 and the metal filling layer 296M, as shown in FIG. 13. Also, in some embodiments, the first gate dielectric layer 28-1 may electrically insulate the channel layers 12 from the first gate electrodes GE-1, and the second gate dielectric layer 28-2 may electrically insulate the channel layers 12 from the second gate electrodes GE-2.

The work function tuning layers 29-1 and 29-2 of the gate electrodes GE-1 and GE-2 may be formed to provide the desired work function for nanosheet or nanowire transistors to enhance electrical performance including improved threshold voltage. In some embodiments, the work function tuning layers may include metal, metal carbide, metal nitride, other suitable materials, or a combination thereof. For example, the work function tuning layers include tantalum nitride, tungsten nitride, titanium, titanium nitride, other suitable materials, or a combination thereof. Also, in some other embodiments, the work function tuning layers is an aluminum-containing layer. For example, the aluminum-containing layer includes TiAlC, TiAlO, TiAlN, one or more other suitable materials, or a combination thereof. The work function tuning layer may be deposited using an atomic layer deposition (ALD) process, a chemical vapor deposition (CVD) process, a physical vapor deposition (PVD) process, an electroplating process, an electroless plating process, one or more other applicable processes, or a combination thereof.

In some embodiments, the material of the metal filling layers 295M and 296M may fill the spaces between adjacent work function tuning layers, as shown in FIG. 13. The material of the metal filling layers 295M and 296M may include tungsten, aluminum, copper, cobalt, one or more other suitable materials, or a combination thereof. The material of the metal filling layers 295M and 296M may be deposited using an ALD process, a PVD process, a CVD process, an electroplating process, an electroless plating process, one or more other applicable processes, or a combination thereof. Then, the material of the metal filling layers 295M and 296M are planarized to form the metal filling layers 295M and 296M that have substantially flat top surfaces which are flush with the ILD layer 25, as shown in FIG. 13.

FIG. 14 is a perspective view of a semiconductor structure of FIG. 13, in accordance with some embodiments. FIG. 14 shows the first source/drain (S/D) features 235 and the second source/drain (S/D) features 236 adjacent to the channel layers in the fin structures over the first region A1 and the second region A2. Also, the source/drain (S/D) features 235 and 236 are covered by the ILD layer 25. Referring to FIG. 13 and FIG. 14, the top surface 295a of the metal filling layer 295M and the top surface 296a of the metal filling layer 296M are substantially level with the top surface of the ILD layer 25.

After the structures as shown in FIG. 13 and FIG. 14 are formed, the subsequent processes are performed to complete a FET structure including nanosheet or nanowire transistors. For example, the gate electrodes GE-1 and GE-2 are recessed and the cap insulating layers (not shown) are formed over the respective recessed gate electrode, wherein each of the cap insulating layers includes one or more layers of a silicon nitride-based material, such as SiN. Several S/D contact holes (not shown) are formed in the ILD layer 25 to expose the first source/drain features 235 and the second source/drain features 236 contacting the channel layers 12 of the semiconductor stacks $M1_G$, $M2_G$, $M3_G$, $M4_G$. Also, the gate contact holes (not shown) are formed in the cap insulating layers (not shown) over the gate electrodes GE-1 and GE-2. Also, source/drain contacts (not shown) and gate contacts (not shown) in those contact holes, in accordance with some embodiments of the present disclosure. Details of the subsequent processes for forming the FET structure including nanosheet or nanowire transistors are typically known and not described herein.

Referring to FIG. 13, according to some embodiments, the first semiconductor stacks $M1_G$ and $M2_G$ are formed over the first region A1, and each of the first semiconductor stacks $M1_G$ and $M2_G$ includes several channel layers 12 and the first gate structure (e.g. including the first gate dielectric layers 28-1 and the first gate dielectric layer GE-1) on the corresponding channel layers 12. The channel layers 12 are formed above the substrate 10 and spaced apart from each other in the direction vertical to the substrate 10. The second semiconductor stacks $M3_G$ and $M4_G$ are formed over the second region A2, and each of the second semiconductor stacks $M3_G$ and $M4_G$ includes several channel layers 12 and the second gate structure (e.g. including the second gate dielectric layers 28-2 and the second gate dielectric layer GE-2) on the corresponding channel layers 12. The number of channel layers 12 of the first semiconductor stack $M1_G$ or $M2_G$ over the first region A1 is different from the number of channel layers 12 of the second semiconductor stack $M3_G$ or $M4_G$ over the second region A2.

In some embodiments, the first gate structure of the first semiconductor stack $M1_G$ or $M2_G$ over the first region A1 of the substrate 10 is a gate of a transistor for forming a high-power device subsequently, while the second gate structure of the second semiconductor stack $M3_G$ or $M4_G$ over the second region A2 is a gate of a transistor for forming a low-power device subsequently. Accordingly, the number of channel layers 12 of the first semiconductor stack $M1_G$ or $M2_G$ over the first region A1 is less than the number of channel layers 12 of the second semiconductor stack $M3_G$ or $M4_G$ over the second region A2.

Although FIG. 13 depicts the first semiconductor stack (e.g. $M1_G$ or $M2_G$) over the first region A1 includes three channel layers and the second semiconductor stack (e.g. $M3_G$ or $M4_G$) includes two channel layers over the second region A2, it should be noted that the first semiconductor stack (e.g. $M1_G$ or $M2_G$) may include more than three channel layers, and the second semiconductor stack (e.g. M3G or M4G) may include two or more channel layers over the second region A2. In some embodiments, a difference between the number of channel layers 12 of the first semiconductor stack (e.g. $M1_G$ or $M2_G$) and the number of channel layers in the second semiconductor stack (e.g. $M3_G$ or $M4_G$) is equal to (but not limited to) 1 or greater than 1. For example, when the number of first semiconductor stack (e.g. $M1_G$ or $M2_G$) over the first region A1 is N, the number of second semiconductor stack (e.g. $M3_G$ or $M4_G$) over the second region A2 may be N−1, N−2 or N−3, etc., wherein N is a positive integer equal to or greater than 4.

In addition, according to some embodiments, formation of the gate structures, such as forming the first gate structure and the second gate structure respectively over the first region A1 and the second region A2 of the substrate 10, is performed after the reduction in the number of channel layers over the second region A2 is completed in the same process, as shown in FIG. 11 to FIG. 13. Thus, the portion of the second gate electrode layer GE-2 above the uppermost channel layer (e.g. the second channel layer 12-2) over the second region A2 is thicker than the portion of the first gate electrode layer GE-1 above the uppermost channel layer (e.g. the third channel layer 12-3) over the first region A1.

As shown in FIG. 13, the first distance d11 is defined as the distance in the third direction D3 between the top surface of the gate structure (e.g. the top surface 295a of the metal filling layer 295M) of the first semiconductor stack ($M1_G$ or $M2_G$) and the top surface of the uppermost channel layer (e.g. the third channel layer 12-3) of the channel layers 12 of the first semiconductor stack ($M1_G$ or $M2_G$). The second distance d21 is defined as the distance in the third direction D3 between the top surface of the gate structure (e.g. the top surface 296a of the metal filling layer 296M) of the second semiconductor stack (e.g. M3G or M4G) and the top surface of the uppermost channel layer (e.g. the second channel layer 12-2) of the channel layers 12 of the second semiconductor stack (e.g. $M3_G$ or $M4_G$). The second distance d21 is greater than the first distance d11.

In addition, in some embodiments, the third distance dcc is defined as the distance in the third direction D3 between adjacent channel layers 12 of the second semiconductor stacks (e.g. $M3_G$ or $M4_G$) over the second region A2. Each of the channel layers 12 has the thickness Tc. As shown in FIG. 13, the second distance d21 is at least equal to the sum of the first distance d11, the thickness Tc, and the third distance dcc, in accordance with some embodiments.

In addition, in some embodiments, the first distance d11 is greater than about 1.3 times the third distance dcc. In some embodiments, the first distance d11 is greater than about 1.5 times the third distance dcc. In some embodiments, the first distance d11 is greater than about 2.0 times the third distance dcc.

Although several semiconductor stacks formed over two regions of the substrate 10 and having different numbers of the channel layers 12 are depicted in the drawings for illustrating the embodiments, it should be noted that the present disclosure is not limited the aforementioned arrangement. In some other embodiments, the substrate 10 may have more than two regions for forming the semiconductor stacks with different numbers of the channel layers.

Figure 15:
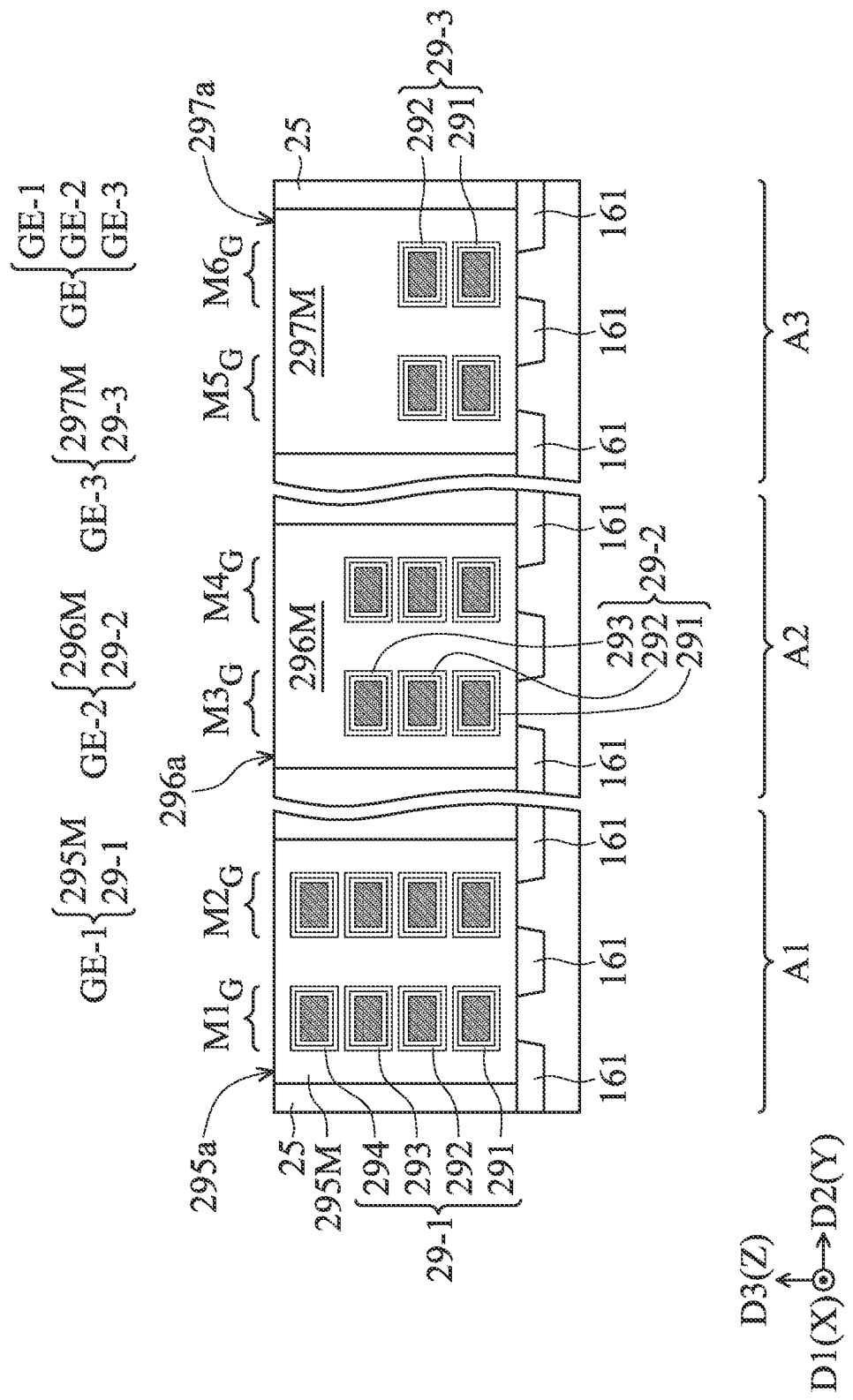
FIG. 15 is a cross-sectional view of another semiconductor structure, in accordance with some embodiments.

FIG. 15 is a cross-sectional view of another semiconductor structure, in accordance with some embodiments. The same or similar reference numerals or reference designators denote the same or similar elements in FIG. 15 and FIG. 13. It should be noted that structures and material(s) of the elements in FIG. 15 are similar to those in FIG. 13 for the previously described embodiment, so that the details of the elements will not be redundantly repeated herein. In addition, a method for forming the semiconductor structure in FIG. 15 is similar to those for the previously described embodiment, and the details will not be repeated herein.

As shown in FIG. 15, the substrate 10 includes the first region A1, the second region A2 and the third region A3, wherein the first semiconductor stacks $M1_G$ and $M2_G$ are formed over the first region A1, the second semiconductor stacks $M3_G$ and $M4_G$ are formed over the second region A2, and the third semiconductor stacks $M5_G$ and $M6_G$ are formed over the third region A3. Also, the third gate structure (including the third gate dielectric layer 28-3 and the third gate electrodes GE-3) is formed over the third region A3, wherein the third gate electrodes GE-3 may include the work function tuning layers 29-3 and the metal filling layer 297M. After the reduction in the number of channel layers is performed, the numbers of the channel layers in the first semiconductor stacks $M1_G$ and $M2_G$, the second semiconductor stacks $M3_G$ and $M4_G$ and the third semiconductor stacks $M5_G$ and $M6_G$ may be different from each other, so as to meet the performance requirements of the devices formed on those regions. In some embodiments, each of the first semiconductor stacks $M1_G$ and $M2_G$ includes four channel layers 12, each of the second semiconductor stacks $M3_G$ and $M4_G$ includes three channel layers 12, and each of the third semiconductor stacks $M5_G$ and $M6_G$ includes two channel layers 12, as shown in FIG. 15.

According to some embodiments described above, the semiconductor structure and method of forming the same achieve several advantages. After the sacrificial gate structures (e.g. 231 and 232) and the sacrificial layers 11 have been removed, the numbers of the channel layers in the fin structures in different regions can be selectively reduced, by removing one or more exposed channel layers in the fin structures in one or more regions. Accordingly, after fabrication, the numbers of the channel layers in the semiconductor stacks (such as $M1_G$, $M2_G$, $M3_G$, $M4_G$) can meet the requirements of operation conditions, thereby reducing the leakage current of the (nanosheet or nanowire) transistors, and improving the electrical performance of the transistors, in accordance with some embodiments.

In addition, the method of forming the semiconductor structure, in accordance with some embodiments, is simple and compatible with the current process. For example, the channel layers in the fin structures are selectively removed to reduce the number of channel layers after the sacrificial gate structures (e.g. 231 and 232) and the sacrificial layers 11 of the fin structures have been removed and before the gate structures are formed. Therefore, the processes for reducing the number of channel layers would have no considerable effect on the other features of the transistors, such as the source/drain features embedded in the ILD layer formed before the reduction in the number of channel layers and the gate structures formed after the reduction of the channel layers.

Also, many processes of the method for forming the structures over the first region A1 and the second region A2 of the substrate 10 can be performed simultaneously. For example, the first sacrificial gate structure 231 over the first fin structures M1 and M2 and the second sacrificial gate structure 232 over the second fin structures M3 and M4 are removed in the same step, as shown in FIG. 7. Also, the first gate structure and the second gate structure can be respectively formed over the first region A1 and the second region A2 of the substrate 10 in the same step, as shown in FIGS. 12 and 13. Therefore, the method for forming a semiconductor structure of the embodiments provides a simple fabrication method that is compatible with the current method. Also the method of the embodiments forms a semiconductor structure with flat surfaces. For example, the top surface 295a of the metal filling layer 295M is level with the top surface 296a of the metal filling layer 296M, as shown in FIG. 13.

It should be noted that the details of the structures of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a first semiconductor stack and a second semiconductor stack respectively formed over a first region and a second region of a substrate, wherein the first semiconductor stack and the second semiconductor stack extend in a first direction and are spaced apart from each other in a second direction, which is different from the first direction, and each of the first semiconductor stack and the second semiconductor stack comprises:
channel layers above the substrate and spaced apart from each other in a third direction, wherein the third direction is vertical to the first direction and the second direction; and
a gate structure, comprising:
gate dielectric layers formed around respective channel layers; and
a gate electrode layer formed on the gate dielectric layers to surround the channel layers,
wherein a number of the channel layers in the second semiconductor stack is less than a number of the channel layers in the first semiconductor stack, and
wherein the gate structure of the first semiconductor stack over the first region of the substrate is a gate of a first transistor, while the gate structure of the second semiconductor stack over the second region of the substrate is another gate of a second transistor that is electrically independent from the first transistor; and
a first power source electrically connecting to the first transistor and a second power source electrically connecting to and the second transistor, wherein the second power source has a lower power than the first power source.

2. The semiconductor structure as claimed in claim 1, wherein a difference between the number of the channel layers in the first semiconductor stack and the number of the channel layers in the second semiconductor stack is equal to or greater than 1.

3. The semiconductor structure as claimed in claim 1, wherein the number of the channel layers in the first semiconductor stack is N, and the number of the channel layers in the second semiconductor stack is N−1 or N−2 or N−3, wherein N is a positive integer equal to or greater than 4.

4. The semiconductor structure as claimed in claim 1, wherein a top surface of the gate structure of the first semiconductor stack is level with a top surface of the gate structure of the second semiconductor stack.

5. The semiconductor structure as claimed in claim 1, wherein a distance in the third direction between a top surface of the gate structure of the first semiconductor stack and a top surface of an uppermost channel layer of the channel layers in the first semiconductor stack is referred to as a first distance; and
a distance in the third direction between a top surface of the gate structure of the second semiconductor stack and a top surface of an uppermost channel layer of the channel layers in the second semiconductor stack is referred to as a second distance,
wherein the second distance is greater than the first distance.

6. The semiconductor structure as claimed in claim 1, wherein the channel layers include a material containing one or more elements selected from group IV semiconductor materials or selected from group III-V semiconductor materials.

7. The semiconductor structure as claimed in claim 1, further comprising:
a third semiconductor stack formed over a third region of the substrate and extending in the first direction, wherein the third semiconductor stack and the second semiconductor stack are spaced apart from each other, and the third semiconductor stack comprises:
other channel layers above the substrate and spaced apart from each other in the third direction; and
another gate structure around the other channel layers,
wherein the number of the other channel layers in the third semiconductor stack is different from the number of the channel layers in the second semiconductor stack, and also different from the number of the channel layers in the first semiconductor stack.

8. A method of forming a semiconductor structure, comprising:
providing a structure comprising:
a first fin structure and a second fin structure respectively over a first region and a second region of a substrate, wherein the first fin structure includes a first stack of alternating channel layers and sacrificial layers within the first stack, and the second fin structure includes a second stack of alternating channel layers and sacrificial layers within the second stack;

a first sacrificial gate structure over the first fin structure, and a second sacrificial gate structure over the second fin structure;

second source/drain features on opposite sides of the second sacrificial gate structure, wherein the second source/drain features are adjacent to the channel layers in the second fin structure; and an interlayer dielectric (ILD) layer over the substrate and covering the second source/drain features, wherein the ILD layer exposes the first sacrificial gate structure and the second sacrificial gate structure;

removing the first sacrificial gate structure and the second sacrificial gate structure;

removing the first sacrificial layers in the first fin structure and the second sacrificial layers in the second fin structure so that the channel layers in the first fin structure and the second fin structure are exposed;

removing a portion of the exposed channel layers, comprising:
  forming a mask layer over the substrate, wherein the mask layer includes:
    a first part covering the exposed channel layers in the first stack; and
    a second part exposing the portion of the exposed channel layers in the second stack and covering the remaining portions of the exposed channel layers in the second stack;
  removing the portion of the exposed channel layers in the second stack; and
  removing the mask layer; and forming a gate structure around remaining portions of the exposed channel layers.

9. The method as claimed in claim 8, wherein the structure further comprises:
  first source/drain features on opposite sides of the first sacrificial gate structure, wherein the first source/drain features are adjacent to the channel layers in the first fin structure,
  wherein the interlayer dielectric (ILD) layer covers the first source/drain features and the second source/drain features, and the first sacrificial gate structure and the second sacrificial gate structure are exposed.

10. The method as claimed in claim 9, wherein after the portion of the exposed channel layers in the second stack is removed, the number of the exposed channel layers in the first stack is greater than the number of the exposed channel layers in the second stack.

11. The method as claimed in claim 8, wherein the mask layer comprises:
  a first material layer fully filling spaces that are formed by removing the first sacrificial gate structure and the second sacrificial gate structure, wherein the first material layer covers the exposed channel layers in the first stack and the second stack;
  a second material layer on the first material layer; and
    a third material layer on the second material layer, wherein the third material layer comprises a pattern for exposing a portion of the second material layer over the second region of the substrate.

12. The method as claimed in claim 8, wherein before the portion of the exposed channel layers in the second stack is removed, the first sacrificial gate structure over the first fin structure and the second sacrificial gate structure over the second fin structure are removed in a same removal step.

13. The method as claimed in claim 8, wherein after the portion of the exposed channel layers in the second stack is removed, the method further comprises a first gate structure around the exposed channel layers in the first stack, wherein the gate structure around the remaining portions of the exposed channel layers in the second stack is a second gate structure.

14. The method as claimed in claim 13, wherein the first gate structure and the second gate structure are respectively formed over the first region and the second region of the substrate in a same processing step.

15. A semiconductor structure, comprising:
  semiconductor stacks comprising a first semiconductor stack and a second semiconductor stack over a substrate, wherein each of the semiconductor stacks extends in a first direction, and adjacent semiconductor stacks are spaced apart from each other in a second direction, which is different from the first direction, wherein each of the semiconductor stacks comprises:
    channel layers above the substrate and spaced apart from each other in a third direction, wherein the third direction is vertical to the first direction and the second direction; and
    a gate structure, comprising:
      gate dielectric layers formed around respective channel layers; and
      a gate electrode layer formed on the gate dielectric layers to surround the channel layers,
  wherein a number of the channel layers in the first semiconductor stack is greater than a number of the channel layers in the second semiconductor stack, the gate structure of the first semiconductor stack over a first region of the substrate is a gate of a first transistor, while the gate structure of the second semiconductor stack over a second region of the substrate is another gate of a second transistor that is electrically independent from the first transistor, and
  wherein a distance in the third direction between a top surface of the gate structure of the first semiconductor stack and a top surface of an uppermost channel layer of the channel layers in the first semiconductor stack is referred to as a first distance, and a distance in the third direction between adjacent channel layers in the first semiconductor stack is referred to as a second distance, wherein the first distance is greater than 1.3 times the second distance; and
  a first power source electrically connecting to the first transistor and a second power source electrically connecting to and the second transistor, wherein the second power source has a lower power than the first power source.

16. The semiconductor structure as claimed in claim 15, wherein the first distance is equal to or greater than 1.5 times the second distance.

17. The semiconductor structure as claimed in claim 15, wherein the first distance is equal to or greater than 2.0 times the second distance.

18. The semiconductor structure as claimed in claim 15, wherein the top surface of the gate structure of the first semiconductor stack is level with a top surface of the gate structure of the second semiconductor stack.

19. The semiconductor structure as claimed in claim 15, wherein a distance in the third direction between a top surface of the gate structure of the second semiconductor stack and a top surface of an uppermost channel layer of the channel layers in the second semiconductor stack is referred to as a third distance, wherein the third distance is greater than the first distance.

\* \* \* \* \*